US012690319B2

(12) United States Patent
Koo et al.

(10) Patent No.: US 12,690,319 B2
(45) Date of Patent: Jul. 21, 2026

(54) DISPLAY DEVICE AND MANUFACTURING METHOD THEREOF

(71) Applicant: Samsung Display Co., LTD., Yongin-si (KR)

(72) Inventors: Bon Yong Koo, Yongin-si (KR); Sun Hwa Lee, Yongin-si (KR); Su Jin Lee, Yongin-si (KR); Jae Yong Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 783 days.

(21) Appl. No.: 17/885,892

(22) Filed: Aug. 11, 2022

(65) Prior Publication Data

US 2023/0132129 A1 Apr. 27, 2023

(30) Foreign Application Priority Data

Oct. 22, 2021 (KR) ........................ 10-2021-0141855

(51) Int. Cl.
*H10H 29/14* (2025.01)
*G09G 3/3233* (2016.01)
*H10H 20/01* (2025.01)

(52) U.S. Cl.
CPC ......... *H10H 29/142* (2025.01); *G09G 3/3233* (2013.01); *H10H 20/018* (2025.01); *G09G 2300/0819* (2013.01); *G09G 2300/0842* (2013.01)

(58) Field of Classification Search
CPC ... H10H 29/142; H10H 20/018; G09G 3/3233
See application file for complete search history.

(56) References Cited

U.S. PATENT DOCUMENTS

| | | | | |
|---|---|---|---|---|
| 2015/0214280 A1* | 7/2015 | Furuie | ................. | H10K 59/352 |
| | | | | 257/89 |
| 2016/0203748 A1* | 7/2016 | Matsueda | ............ | H10K 59/353 |
| | | | | 345/694 |
| 2020/0066809 A1* | 2/2020 | Liu | ....................... | H10K 59/121 |
| 2020/0152832 A1* | 5/2020 | Yoon | ................... | H10H 20/819 |
| 2021/0241671 A1* | 8/2021 | Lee | ....................... | G09G 3/3233 |
| 2023/0300976 A1* | 9/2023 | Li | ........................... | G09F 9/302 |
| | | | | 361/748 |

FOREIGN PATENT DOCUMENTS

| | | |
|---|---|---|
| JP | 2010251360 A | 11/2010 |
| KR | 1020170120488 A | 10/2017 |
| KR | 1020180014807 A | 2/2018 |
| KR | 10-1973855 | 8/2019 |
| KR | 1020200034896 A | 4/2020 |
| KR | 1020210028795 A | 3/2021 |

* cited by examiner

*Primary Examiner* — Abdulmajeed Aziz
*Assistant Examiner* — Nathaniel J Lee
(74) *Attorney, Agent, or Firm* — CANTOR COLBURN LLP

(57) ABSTRACT

A display device a pixel circuit layer disposed on a substrate and including a first pixel circuit area and a second pixel circuit area; and a display element layer disposed on the pixel circuit layer and including a first electrode and a second electrode. The display element layer includes light emitting elements arranged in a matrix form defined by a first arrangement direction and a second arrangement direction, and the first electrode and the second electrode are rotated by an angle, respectively.

20 Claims, 34 Drawing Sheets

GAT1: Cst_E1, E1, S11, S21, S31, S41
GAT2: Cst_E2, PL3
SD1: BRP1~BRP5, PL4
SD2: BRP6, D1~D3, PL1
ELT1: ELT11, ELT12, ELT13

ACT: SCL
GAT1: GE1, S11, E1, Cst_E1
GAT2: Cst_E2
SD1: BRP4, PL4
SD2: BRP6, D2, PL1

DISPLAY DEVICE AND MANUFACTURING METHOD THEREOF

CROSS-REFERENCE TO RELATED APPLICATION(S)

This application claims priority to and benefits of Korean Patent Application No. 10-2021-0141855 under 35 U.S.C. § 119, filed Oct. 22, 2021, in the Korean Intellectual Property Office (KIPO), the entire contents of which are incorporated herein by reference.

BACKGROUND

1. Technical Field

The disclosure relates to a display device and a manufacturing method thereof.

2. Description of the Related Art

Recently, as interest in information display is increasing, research and development on display devices are continuously made.

SUMMARY

The disclosure to provide a display device having improved arrangement efficiency of light emitting elements by increasing a proportion of light emitting elements capable of normal operation, and a manufacturing method thereof.

The objects of the disclosure are not limited to the object mentioned above, and other technical objects that are not mentioned may be clearly understood to a person of an ordinary skill in the art using the following description.

A display device according to an embodiment of the disclosure a pixel circuit layer disposed on a substrate and including a first pixel circuit area and a second pixel circuit area which are spaced apart from each other in a first direction, and extending in a second direction perpendicular to the first direction; and a display element layer disposed on the pixel circuit layer and including a first electrode corresponding to the first pixel circuit area and a second electrode corresponding to the second pixel circuit area.

The display element layer may include light emitting elements which are disposed on the first electrode and the second electrode and are arranged in a matrix form defined by a first arrangement direction and a second arrangement direction perpendicular to the first arrangement direction, the first electrode and the second electrode may be rotated by an angle in a clockwise or counterclockwise direction with respect to a center point of the first electrode and a center point of the second electrode respectively, to extend in a third direction and be spaced apart from each other in a fourth direction intersecting the third direction, and the fourth direction and the second arrangement direction may not be parallel to each other.

The display element layer may include a display area and a non-display area surrounding the display area, and a first arrangement distance between the light emitting elements in an outer portion of the display area is greater than a second arrangement distance between the light emitting elements in a central portion of the display area.

The angle may increase as the first arrangement distance increases compared to the second arrangement distance.

A rotation direction of the first electrode and a rotation direction of the second electrode may be substantially identical to each other in the entire display area.

The display area may include a first display area and a second display area adjacent to each other in the first direction, an area of the first display area and an area of the second display area being substantially equal to each other, and a rotation direction of the first electrode and a rotation direction of the second electrode may be a clockwise direction in the first display area and a counterclockwise direction in the second display area.

The display area may further include a third display area adjacent to the first display area in the second direction, an area of the third display area and the area of the first display area being substantially equal to each other, and a fourth display area adjacent to the second display area in the second direction, an area of the fourth display area and the area of the second display area being substantially equal to each other, and the rotation directions of the first electrode and the second electrode may be the counterclockwise direction in the third display area and the clockwise direction in the fourth display area.

The third direction and the second arrangement direction may form an acute angle therebetween.

A portion of the first electrode may overlap the second pixel circuit area in a fifth direction perpendicular to the first direction and the second direction.

The pixel circuit layer may further include a third pixel circuit area which is spaced apart from the first pixel circuit area and the second pixel circuit area in the first direction and extends in the second direction, and a portion of the second electrode may overlap the third pixel circuit area in the fifth direction.

The display element layer may further include a third electrode which is spaced apart from the first electrode and the second electrode in the fourth direction and corresponds to the third pixel circuit area, and the third electrode may be rotated by an angle in the clockwise or counterclockwise direction with respect to a center point of the third electrode to extend in the third direction.

A number per unit area of the light emitting elements may be substantially identical on the first electrode, the second electrode, and the third electrode.

The light emitting element may have a size to a degree of a nano-scale to a micro-scale.

A manufacturing method of a display device according to an embodiment of the disclosure includes preparing a substrate in which a pixel circuit layer and a display element layer are sequentially stacked; forming a first semiconductor layer, an active layer, and a second semiconductor layer on a base substrate; providing light emitting elements which are individually separated by etching the first semiconductor layer, the active layer, and the second semiconductor layer, and patterned in a matrix form defined by a first arrangement direction and a second arrangement direction perpendicular to the first arrangement direction; separating the base substrate from the light emitting elements, and connecting the light emitting elements on a donor film; stretching the donor film in the first arrangement direction and the second arrangement direction; and disposing the light emitting elements disposed on the stretched donor film on the substrate.

The preparing of the substrate may include forming the pixel circuit layer including a first pixel circuit area and a second pixel circuit area which are spaced apart from each other in a first direction and extend in a second direction perpendicular to the first direction; forming the display element layer including a first electrode corresponding to the first pixel circuit area and a second electrode corresponding to the second pixel circuit area on the pixel circuit layer.

In the forming of the display element layer, the first electrode and the second electrode may be rotated by an angle in a clockwise or counterclockwise direction with respect to a center point of the first electrode and a center point of the second electrode respectively, to extend in a third direction and be spaced apart from each other in a fifth direction intersecting the third direction, and the third direction and the second arrangement direction may be non-parallel to each other.

The display element layer may include a display area and a non-display area surrounding the display area, and in the stretching of the donor film, a separation distance between the light emitting elements increases, and a first arrangement distance between the light emitting elements in an outer portion of the display area is greater than a second arrangement distance between the light emitting elements in a central portion of the display area.

In the forming of the display element layer, the angle may increase as the first arrangement distance increases compared to the second arrangement distance.

In the forming of the display element layer, a rotation direction of the first electrode and a rotation direction of the second electrode may be substantially identical each other in the entire display area.

The display area may include a first display area and a second display area adjacent to each other in the first direction, an area of the first display area and an area of the second display area being substantially equal to each other, and in the forming of the display element layer, the rotation directions of the first electrode and the second electrode may be a clockwise direction in the first display area and a counterclockwise direction in the second display area.

The display area may further include a third display area adjacent to the first display area in the second direction, an area of the third display area and the area of the first display area being substantially equal to each other, and a fourth display area adjacent to the second display area in the second direction, an area of the fourth display area and the area of the second display area being substantially equal to each other, and in the forming of the display element layer, the rotation directions of the first electrode and the second electrode may be the counterclockwise direction in the third display area and the clockwise direction in the fourth display area.

The third direction and the second arrangement direction may form an angle having an acute angle therebetween.

A portion of the first electrode may overlap the second pixel circuit area in a fifth direction perpendicular to the first direction and the second direction.

The solutions to problems of the disclosure are not limited to the above-described solutions, and solutions not mentioned will be clearly understood by those of ordinary skill in the art to which the disclosure belongs from the disclosure and the accompanying drawings.

According to an embodiment of the disclosure, a display device having improved arrangement efficiency of light emitting elements by increasing a ratio of light emitting elements capable of normal operation, and a manufacturing method thereof may be provided.

The effects of the disclosure are not limited to the above-described effects, and the effects not mentioned will be clearly understood by those of ordinary skill in the art to which the disclosure belongs from the disclosure and accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
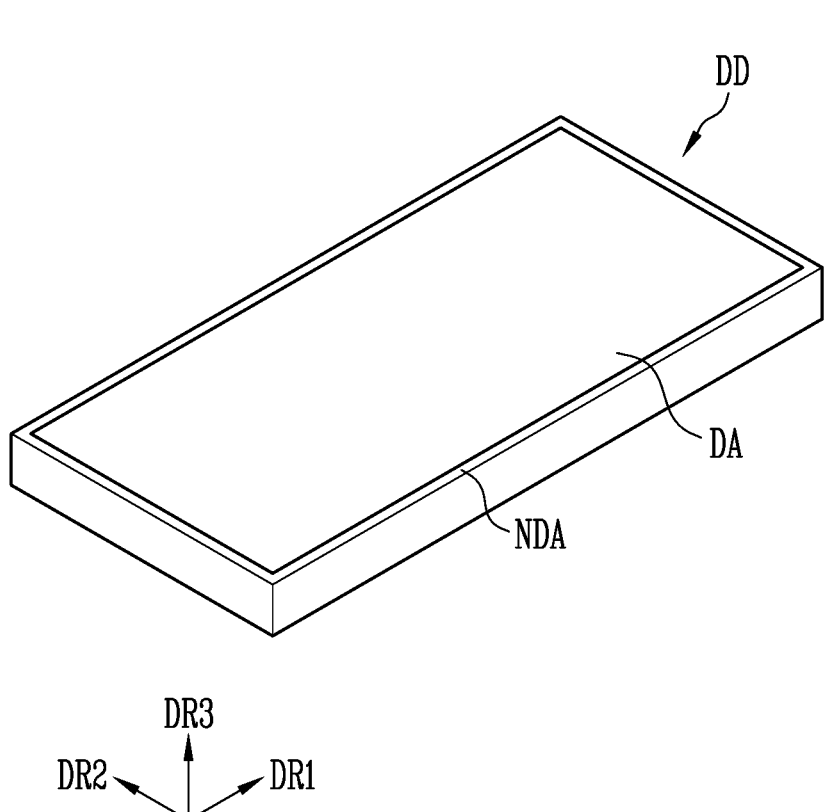
FIG. 1 is a perspective view schematically illustrating a display device according to an embodiment.

The embodiments described in this specification are for clearly explaining the spirit of the disclosure to those of ordinary skill in the art to which the disclosure pertains, so the disclosure is not limited by the embodiments described herein, and the scope of the disclosure should be interpreted as including modifications or variations that do not depart from the spirit of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

The drawings attached to this specification are for illustration of the disclosure, and the shapes shown in the drawings may be exaggerated as necessary to help understand the disclosure, so the disclosure is not limited by the drawings.

In the specification, when it is determined that a detailed description of a known configuration or function related to the disclosure may obscure the gist of the disclosure, a detailed description thereof will be omitted if necessary.

Figure 2:
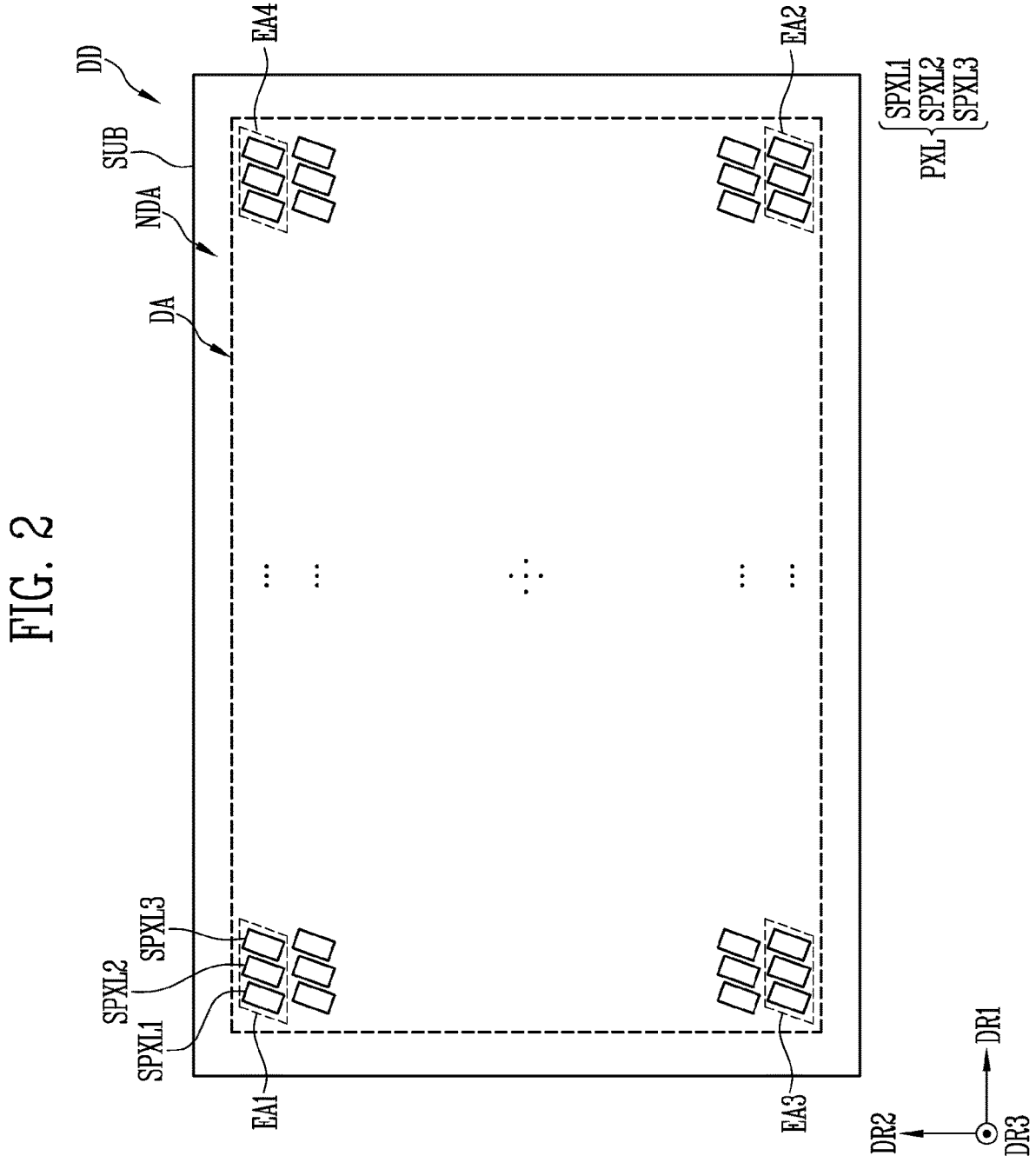
FIG. 2 is a plan view schematically illustrating a display device according to an embodiment.

FIG. 1 is a perspective view schematically illustrating a display device according to an embodiment. FIG. 2 is a plan view schematically illustrating a display device according to an embodiment.

Referring to FIGS. 1 and 2, a display device DD according to an embodiment may emit light.

The display device DD may include a substrate SUB and a pixel PXL disposed on the substrate SUB. Although not shown in the drawing, the display device DD may further include a driving circuit (e.g., a scan driver and a data driver) for driving the pixel PXL, wires, and pads.

The pixel PXL may include a first sub-pixel SPXL1, a second sub-pixel SPXL2, and a third sub-pixel SPXL3.

The display device DD may include a display area DA and a non-display area NDA. The non-display area NDA may mean an area excluding the display area DA. The non-display area NDA may surround at least a portion of the display area DA.

The substrate SUB may form (or constitute) a base member of the display device DD. The substrate SUB may be a rigid or flexible substrate or film, but is not limited to a specific example.

The display area DA may mean an area in which the pixels PXL are disposed. The non-display area NDA may mean an area in which the pixel PXL is not disposed. A driving circuit, wires, and pads electrically connected to the pixel PXL of the display area DA may be disposed in the non-display area NDA.

According to an embodiment, the pixels PXL may be arranged in a stripe or PENTILE™ arrangement structure, but the disclosure is not limited thereto, and various embodiments may be applied.

A pixel PXL including sub-pixels SPXL1, SPXL2, and SPXL3 may be disposed in the display area DA. For example, in the display area DA, the first sub-pixel SPXL1 emitting light of a first color, the second sub-pixel SPXL2 emitting light of a second color, and the third sub-pixel SPXL3 emitting light of a third color may be arranged, and at least one of the first to third sub-pixels SPXL1, SPXL2, and SPXL3 may form a pixel capable of emitting light of various colors.

Each of the first to third sub-pixels SPXL1, SPXL2, and SPXL3 may emit light of a color. For example, the first sub-pixel SPXL1 may be a red pixel emitting red light, the second sub-pixel SPXL2 may be a green pixel emitting green light, and the third sub-pixel SPXL3 may be a blue pixel emitting blue light. However, the color, type, and/or number of pixels PXL forming each pixel is not limited to a specific example.

Each of the first to third sub-pixels SPXL1, SPXL2, and SPXL3 may have a rectangular shape. In this case, each of the first to third sub-pixels SPXL1, SPXL2, and SPXL3 may be formed by rotating by an angle (e.g., a predetermined or selected angle) in a clockwise (or counterclockwise) direction with respect to a center point of the rectangular shape. According to an embodiment, rotation directions of the first to third sub-pixels SPXL1, SPXL2, and SPXL3 may be the same in the entire display area DA. In this regard, it will be described below in detail with reference to FIGS. 7 to 11B.

Hereinafter, for convenience of description, an embodiment in which the pixel PXL includes the first to third sub-pixels SPXL1, SPXL2, and SPXL3 will be described. The sub-pixel SPXL as defined herein may be any one of the first to third sub-pixels SPXL1, SPXL2, and SPXL3.

Figure 3:
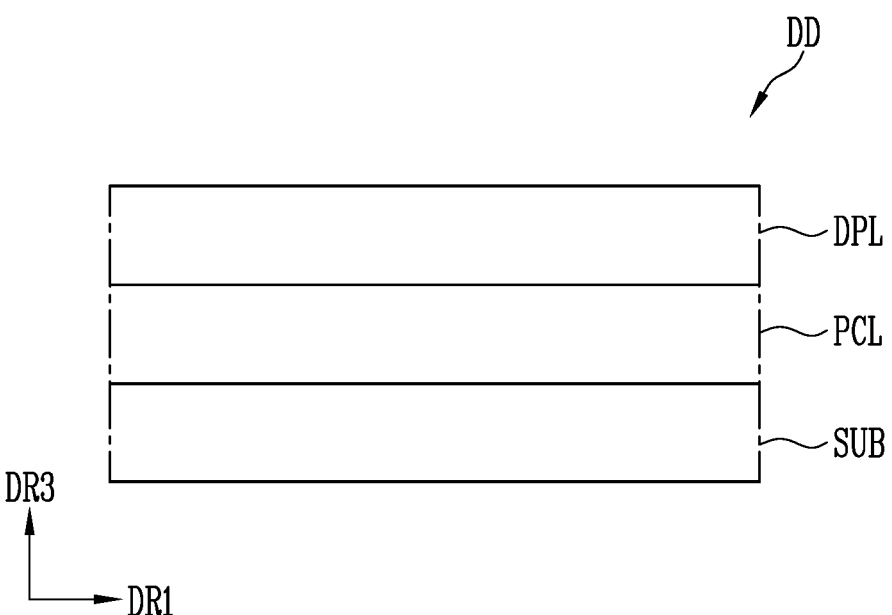
FIG. 3 is a cross-sectional view illustrating a display device according to an embodiment.

FIG. 3 is a schematic cross-sectional view illustrating a display device according to an embodiment.

The display device DD may include a substrate SUB, a pixel circuit layer PCL, and a display element layer DPL. According to an embodiment, the substrate SUB, the pixel circuit layer PCL, and the display element layer DPL may be sequentially stacked in a display direction (e.g., a third direction DR3) of the display device DD. The display direction may mean a thickness direction of the substrate SUB.

The substrate SUB may form a base surface of the display device DD. Individual components of the display device DD may be disposed on the substrate SUB.

The pixel circuit layer PCL may be disposed on the substrate SUB. The pixel circuit layer PCL may include a pixel circuit PXC (see FIG. 4) (or a first pixel circuit area PXC1, a second pixel circuit area PXC2, and a third pixel circuit area PXC3 of FIG. 5) configured to drive the pixel PXL.

The display element layer DPL may be disposed on the pixel circuit layer PCL. The display element layer DPL may emit light based on an electrical signal provided from the pixel circuit layer PCL. The display element layer DPL may include a light emitting element LD (see FIG. 4) capable of emitting light.

Figure 4:
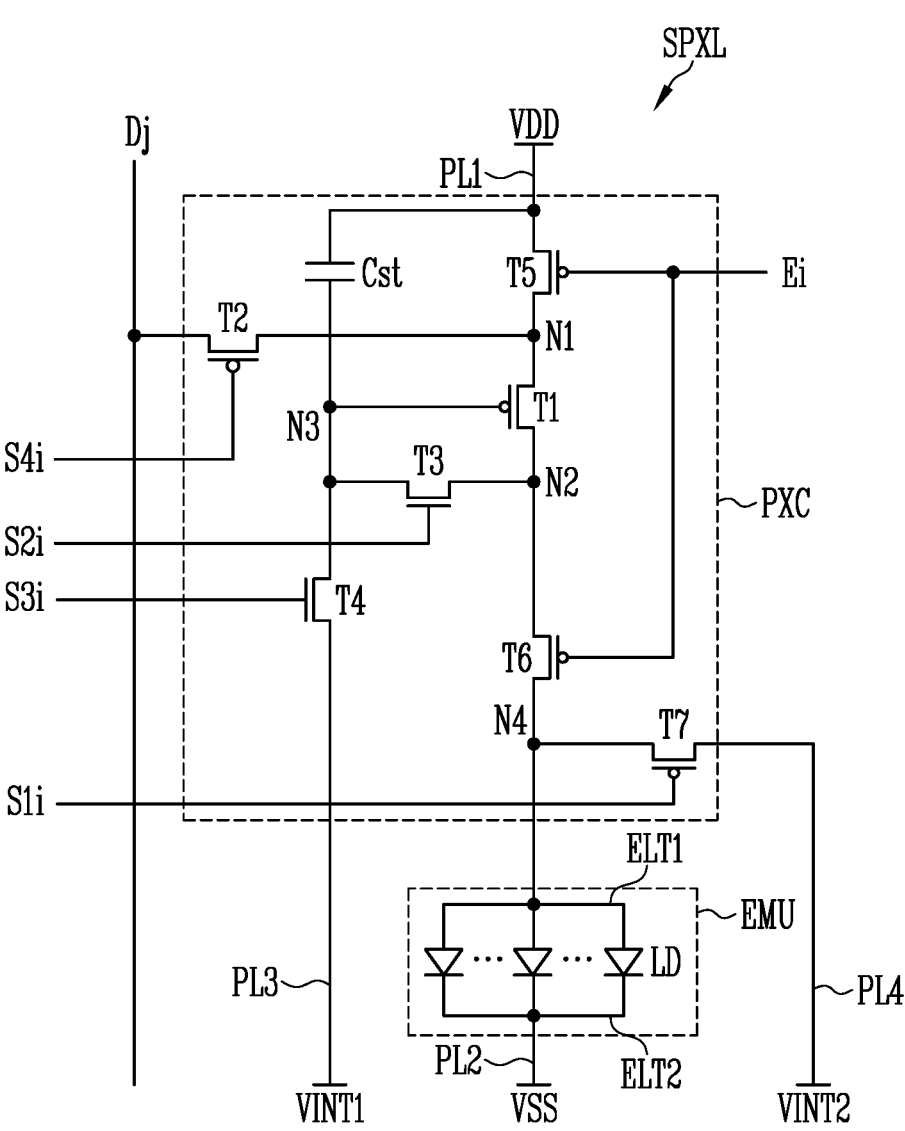
FIG. 4 is a schematic diagram of an equivalent circuit of a pixel circuit included in a pixel according to an embodiment.

FIG. 4 is a schematic diagram of an equivalent circuit of a pixel circuit included in a pixel according to an embodiment.

FIG. 4 illustrates an electrical connection relationship between components included in a sub-pixel SPXL applied to an active display device DD, illustrating an embodiment. However, types of components included in the sub-pixel SPXL to which the embodiment can be applied are not limited thereto. FIG. 4 illustrates the sub-pixel SPXL disposed on the i-th horizontal line (or the i-th pixel row) and electrically connected to the j-th data line Dj for convenience of description.

Referring to FIG. 4, the sub-pixel SPXL may include a light emitting part EMU and a pixel circuit PXC. The sub-pixel SPXL may be one of the first to third sub-pixels SPXL1 to SPXL3.

The sub-pixel SPXL may include a light emitting part EMU that generates light having a luminance corresponding to a data signal. Also, the sub-pixel SPXL may include a pixel circuit PXC for driving the light emitting part EMU.

According to an embodiment, the light emitting part EMU may include at least one light emitting element LD electrically connected in parallel between a first power line PL1 to which a voltage of a first driving power VDD is applied and a second power line PL2 to which a voltage of a second driving power VSS is applied. For example, the light emitting part EMU may include a first electrode ELT1 electrically connected to the first driving power VDD via the pixel circuit PXC and the first power line PL1, a second electrode ELT2 electrically connected to the second driving power VSS through the second power line PL2, and light emitting elements LDs electrically connected to each other in parallel in a same direction between the first and second electrodes ELT1 and ELT2. In an embodiment, the first electrode ELT1 may be an anode electrode, and the second electrode ELT2 may be a cathode electrode.

In an embodiment, the light emitting element LD may be an inorganic light emitting diode formed of an inorganic material. In an embodiment, the light emitting element LD may be an organic light emitting diode including an organic light emitting layer. In an embodiment, the light emitting element LD may be a light emitting element composed of an inorganic material and an organic material in combination.

In an embodiment, each of the light emitting elements LD included in the light emitting part EMU may include a first end electrically connected to the first driving power VDD through the first electrode ELT1 and a second end electrically connected to the second driving power VSS through the second electrode ELT2. The first driving power VDD and the second driving power VSS may have different potentials (or voltage levels). For example, the first driving power VDD may be set as a high-potential power, and the second driving power VSS may be set as a low-potential power. In this case, a potential difference between the first and second driving powers VDD and VSS may be set to be greater than or equal to a threshold voltage of the light emitting elements LD during a light emitting period of the sub-pixel SPXL.

As described above, each light emitting element LD in parallel electrically connected to each other in a same direction (e.g., a forward direction) between the first electrode ELT1 and the second electrode ELT2 to which voltages of different potentials are supplied may form effective light sources, respectively. These effective light sources may collectively form the light emitting part EMU of the sub-pixel SPXL.

The light emitting elements LD of the light emitting part EMU may emit light with a luminance corresponding to a driving current supplied through the corresponding pixel circuit PXC. For example, during each frame period, the pixel circuit PXC may supply a driving current, corresponding to a grayscale value of corresponding frame data, to the light-emitting part EMU. The driving current supplied to the light emitting part EMU may divide and flow through the light emitting elements LD electrically connected in the same direction. Accordingly, while each light-emitting element LD emits light with a luminance corresponding to the current flowing therein, the light-emitting part EMU may emit light of luminance corresponding to the driving current.

The pixel circuit PXC may include first to seventh transistors T1 to T7 and a storage capacitor Cst.

A first electrode of the first transistor T1 (or a driving transistor) may be connected to (or electrically connected to) a first node N1, and a second electrode of the first transistor T1 may be electrically connected to a second node N2. A gate electrode of the first transistor T1 may be electrically connected to a third node N3. The first transistor T1 may control the current amount flowing to the second driving power VSS via the light emitting element LD from the first driving power VDD in response to a voltage (or a data signal provided to the gate electrode from the j-th data line Dj) of the third node N3.

The second transistor T2 (or a write transistor) may be electrically connected between the j-th data line Dj and the first node N1. A gate electrode of the second transistor T2 may be electrically connected to a 4i-th scan line S4*i*. The second transistor T2 may be turned on in case that a fourth scan signal is supplied to the 4i-th scan line S4*i*, to electrically connect the j-th data line Dj to the first node N1.

The third transistor T3 (or a compensation transistor) may be electrically connected between the second electrode (for example, the second node N2) of the first transistor T1 and the gate electrode (for example, the third node N3) of the first transistor T1. The gate electrode of the third transistor T3 may be electrically connected to a 2i-th scan line S2*i*. The third transistor T3 may be turned on in case that a second scan signal is supplied to the 2i-th scan line S2*i*, to electrically connect the second electrode and the gate electrode (or the second node N2 and the third node N3) of the first transistor T1 to each other. For example, a timing at which the second electrode (e.g., the drain electrode) of the first transistor T1 and the gate electrode of the first transistor T1 are electrically connected may be controlled by the second scan signal. In case that the third transistor T3 is turned on, the first transistor T1 may be electrically connected in a form of a diode.

The fourth transistor T4 (or an initialization transistor) may be electrically connected between the third node N3 and a first initialization power VINT1 (or a third power line PL3 to which the first initialization power VINT1 is applied). A gate electrode of the fourth transistor T4 may be electrically connected to a 3i-th scan line S3*i*. The fourth transistor T4 may be turned on in case that a third scan signal is supplied to the 3i-th scan line S3*i*, to supply a voltage of the first initialization power VINT1 to the third node N3. In case that the fourth transistor T4 is turned on, the gate voltage of the first transistor T1 may be initialized to the voltage of the first initialization power VINT1.

The fifth transistor T5 (or a first light emitting transistor) may be electrically connected between the first driving power VDD and the first node N1. A gate electrode of the fifth transistor T5 may be electrically connected to an i-th light emitting control line Ei. The fifth transistor T5 may be turned off in case that a light emitting control signal is supplied to the i-th light emitting control line Ei, and may be turned on in other cases.

The sixth transistor T6 (or a second light emitting transistor) may be electrically connected between the second electrode (for example, the second node N2) of the first transistor T1 and the first electrode ELT1 (for example, the fourth node N4) of the light emitting part EMU. A gate electrode of the sixth transistor T6 may be electrically connected to the i-th light emitting control line Ei. The sixth transistor T6 may operate in substantially the same manner as that of the fifth transistor T5.

The seventh transistor T7 (a switching transistor or a bypass transistor) may be electrically connected between the first electrode ELT1 (for example, a fourth node N4) of the light emitting part EMU and a fourth power line PL4. A gate electrode of the seventh transistor T7 may be electrically connected to a 1i-th scan line S1i. The seventh transistor T7 may be turned on in case that a first scan signal is supplied to the 1i-th scan line S1i, to electrically connect the first electrode ELT1 of the light emitting part EMU to the fourth power line PL4.

A voltage of a second initialization power VINT2 may be applied to the fourth power line PL4.

In this case, the voltage of the second initialization power VINT2 may be supplied to the first electrode ELT1 of the light emitting part EMU, and a parasitic capacitor of the light emitting element LD may be discharged. As a residual voltage charged in the parasitic capacitor is discharged (removed), unintentional fine light emission may be prevented. Accordingly, the ability of the pixel PXL to display a black color may be improved. The voltage of the second initialization power VINT2 may be set such that the voltage of the second initialization power VINT2 is lower than the sum of the threshold voltage of the light emitting element LD and the voltage of the second driving power VSS. However, this is only an example, and the voltage of the first initialization power VINT1 and the voltage of the second initialization power VINT2 may be set in various ways. For example, the voltage of the first initialization power VINT1 and the voltage of the second initialization power VINT2 may be substantially the same.

The storage capacitor Cst may be formed or electrically connected between the first power line PL1 and the third node N3. The storage capacitor Cst may store a voltage applied to the third node N3.

The first transistor T1, the second transistor T2, the fifth transistor T5, the sixth transistor T6, and the seventh transistor T7 may be formed as (or formed of) a polysilicon semiconductor transistor. For example, the first transistor T1, the second transistor T2, the fifth transistor T5, the sixth transistor T6, and the seventh transistor T7 may include, as an active layer (or a channel), a polysilicon semiconductor layer formed by a low-temperature polysilicon (LTPS) process. In addition, the first transistor T1, the second transistor T2, the fifth transistor T5, the sixth transistor T6, and the seventh transistor T7 may be P-type transistors (e.g., P-channel metal oxide semiconductor (PMOS) transistors). Accordingly, the gate-on voltage that turns on the first transistor T1, the second transistor T2, the fifth transistor T5, the sixth transistor T6, and the seventh transistor T7 may be at a logic low level. Since the polysilicon semiconductor transistor has an advantage of a fast response speed, it can be used for a switching element requiring fast switching.

The third transistor T3 and the fourth transistor T4 may be formed as an oxide semiconductor transistor. For example, the third transistor T3 and the fourth transistor T4 may be N-type oxide semiconductor transistors (e.g., N-channel metal oxide semiconductor (NMOS) transistors), and may include an oxide semiconductor layer as an active layer. Accordingly, the gate-on voltage that turns on the third transistor T3 and the fourth transistor T4 may be at a logic high level. The oxide semiconductor transistor can be processed at a low temperature and can have a lower charge mobility than the polysilicon semiconductor transistor. For example, the oxide semiconductor transistor can have excellent off-current characteristics. Accordingly, in case that the third transistor T3 and the fourth transistor T4 are formed as oxide semiconductor transistors, leakage current due to low-frequency driving can be minimized, and thus display quality can be improved.

However, the first to seventh transistors T1 to T7 are not limited thereto, and at least one of the first transistor T1, the second transistor T2, the fifth transistor T5, the sixth transistor T6, and the seventh transistors T7 may be formed as an oxide semiconductor transistor, or at least one of the third transistor T3 and the fourth transistor T4 may be formed as a polysilicon semiconductor transistor.

Hereinafter, the structure of the pixel PXL will be described in more detail with reference to FIGS. 5 and 6. Descriptions that may overlap with the above will be briefly described or omitted.

Figure 5:
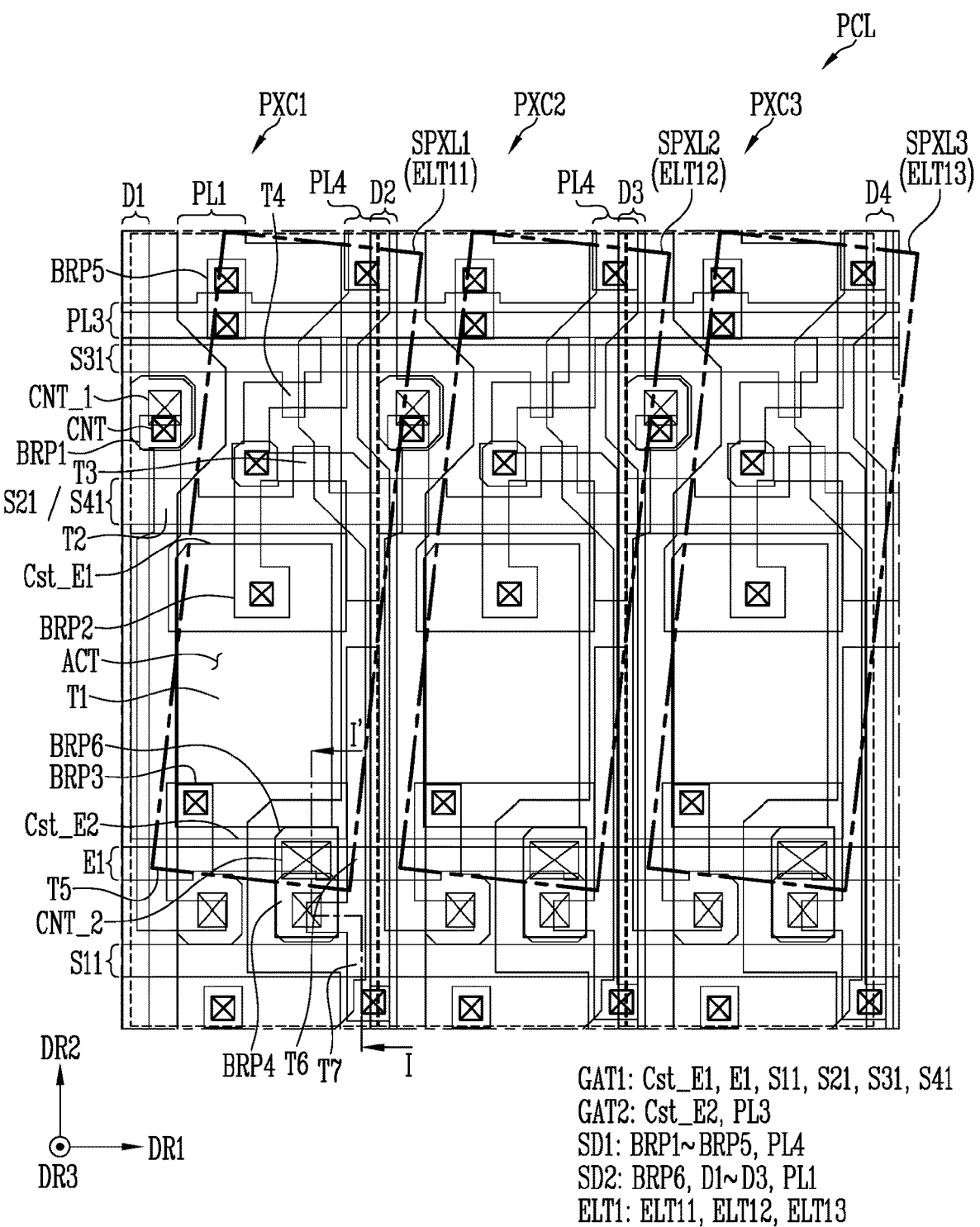
FIG. 5 is a drawing schematically illustrating a pixel included in a display area of FIG. 1 and is a schematic plan view of the pixel viewed from above based on the pixel circuit illustrated in FIG. 4.

FIG. 5 is a drawing schematically illustrating a pixel included in a display area of FIG. 1 and is a schematic plan view of the pixel viewed from above based on the pixel circuit illustrated in FIG. 4.

Referring to FIGS. 1 to 5, the first sub-pixel SPXL1 may include a first pixel circuit area PXC1 and a 1-1-th electrode ELT11 (or a first anode) of the first sub-pixel SPXL1, the second sub-pixel SPXL2 may include a second pixel circuit area PXC2 and a 1-2-th electrode ELT12 (or a second anode) of the second sub-pixel SPXL2, and a third sub-pixel SPXL3 may include a third pixel circuit area PXC3 and a 1-3-th electrode ELT13 (or a third anode) of the third sub-pixel SPXL3.

According to embodiments, the pixel circuit layer PCL may include the first pixel circuit area PXC1, the second pixel circuit area PXC2, and the third pixel circuit area PXC3. For example, the first pixel circuit area PXC1, the second pixel circuit area PXC2, and the third pixel circuit area PXC3 may have a rectangular shape. The first pixel circuit area PXC1, the second pixel circuit area PXC2, and the third pixel circuit area PXC3 may be arranged in the first direction DR1, and each thereof may extend in a second direction DR2 perpendicular to the first direction DR1.

According to an embodiment, the display element layer DPL may include the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3. For example, the 1-1-th electrode ELT11 (or first anode) of the first sub-pixel SPXL1, the 1-2-th electrode ELT12 (or the second anode) of the second sub-pixel SPXL2, and the 1-3-th electrode ELT13 (or the third anode) of the third sub-pixels SPXL3 may have a rectangular shape. The 1-1-th electrode ELT11 (or the first anode) of the first sub-pixel SPXL1 may be disposed at an angle with respect to the first pixel circuit area PXC1 in a plan view.

Accordingly, a portion of the 1-1-th electrode ELT11 (or the first anode) of the first sub-pixel SPXL1 may overlap the second pixel circuit area PXC2 in the third direction DR3. The 1-2-th electrode ELT12 (or the second anode) of the second sub-pixel SPXL2 may be disposed at an angle with respect to the second pixel circuit area PXC2 in a plan view. Accordingly, a portion of the 1-2-th electrode ELT12 (or the second anode) of the second sub-pixel SPXL2 may overlap the third pixel circuit area PXC3 in the third direction DR3. Also, the 1-3-th electrode ELT13 (or the third anode) of the third sub-pixel SPXL3 may be disposed at an angle with respect to the third pixel circuit area PXC3 in a plan view. Accordingly, a portion of the 1-3-th electrode ELT13 (or the third anode) of the third sub-pixel SPXL3 may overlap in the third direction DR3 the first pixel circuit area PXC1 of another pixel PXL adjacent thereto in the first direction DR1.

FIG. 5 illustrates an embodiment in which each of the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 is rotated in a clockwise direction by an angle, the disclosure is not limited thereto. For example, each of the 1-1-th electrode ELT11 (or the first anode) of the first sub-pixel SPXL1, the 1-2-th electrode ELT12 (or the second anode) of the second sub-pixel SPXL2, and the 1-3-th electrodes ELT13 (or the third anode) of the third sub-pixel SPXL3 may be formed by rotating in a counterclockwise direction at an angle.

The relationship between the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 and the light emitting elements LD will be described below in detail with reference to FIGS. 7 to 11B.

Hereinafter, since the first to third sub-pixels SPXL1 to SPXL3 are substantially the same as or similar to each other, the first pixel circuit area PXC1 will be described as representative of the first to third pixel circuit areas PXC1 to PXC3.

The first pixel circuit area PXC1 may include a semiconductor layer ACT, a first conductive layer GAT1, a second conductive layer GAT2, a third conductive layer SD1, and a fourth conductive layer SD2. The semiconductor layer ACT, the first conductive layer GAT1, the second conductive layer GAT2, the third conductive layer SD1, and the fourth conductive layer SD2 may be formed on different layers by different processes.

The semiconductor layer ACT may be an active layer forming channels of the first to seventh transistors T1 to T7. The semiconductor layer ACT may include a source region and a drain region which may contact (or be in contact with) a first transistor electrode (e.g., a source electrode) and a second transistor electrode (e.g., a drain electrode) of each of the first to seventh transistors T1 to T7. A region between the source region and the drain region may be a channel region. The channel region of a semiconductor pattern may be a semiconductor pattern that is not doped with an impurity, and may be an intrinsic semiconductor. The source region and the drain region may be a semiconductor pattern doped with the impurity.

The first conductive layer GAT1 may include a first capacitor electrode Cst_E1, a first light emitting control line E1, an 11-th scan line S11, a 21-th scan line S21, a 31-th scan line S31, and a 41-th scan line S41.

The first capacitor electrode Cst_E1 may have a specific area and may be generally disposed in the center of the first pixel circuit area PXC1. The first capacitor electrode Cst_E1 may form a gate electrode of the first transistor T1.

The first light emitting control line E1 may extend in the first direction DR1 and may be disposed below the first capacitor electrode Cst_E1. The first light emitting control line E1 may form each of the gate electrode of the fifth transistor T5 and the gate electrode of the sixth transistor T6, or may be electrically connected to each of the gate electrode of the fifth transistor T5 and the gate electrode of the sixth transistor T6.

The 11-th scan line S11 may extend in the first direction DR1 and may be disposed at the lowermost side of the first pixel circuit area PXC1. The 11-th scan line S11 may form a gate electrode of the seventh transistor T7 or may be electrically connected to the gate electrode of the seventh transistor T7.

The 21-th scan line S21 may extend in the first direction DR1 and may be disposed above the first capacitor electrode Cst_E1. The 21-th scan line S21 may form a gate electrode of the third transistor T3 or may be electrically connected to the gate electrode of the third transistor T3.

The 31-th scan line S31 may extend in the first direction DR1 and may be disposed adjacent to the uppermost side of the first pixel circuit area PXC1. The 31-th scan line S31 may form a gate electrode of the fourth transistor T4 or may be electrically connected to the gate electrode of the fourth transistor T4.

The 41-th scan line S41 may extend in the first direction DR1 and may form a gate electrode of the second transistor T2 or may be electrically connected to the gate electrode of the second transistor T2.

The first conductive layer GAT1 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The first conductive layer GAT1 may have a single-layer or multi-layer structure, and for example, the first conductive layer GAT1 may have a single-layer structure including molybdenum (Mo).

The second conductive layer GAT2 may include a second capacitor electrode Cst_E2 and a third power line PL3.

The third power line PL3 may extend in the first direction DR1 and may be disposed on the uppermost side of the first pixel circuit area PXC1.

The second capacitor electrode Cst_E2 may overlap the first capacitor electrode Cst_E1, and may form a storage capacitor Cst (see FIG. 4) together with the first capacitor electrode Cst_E1. An area of the second capacitor electrode Cst_E2 may be larger than an area of the first capacitor electrode Cst_E1, and may cover (or overlap, e.g., in a plan view) the first capacitor electrode Cst_E1.

The second conductive layer GAT2 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The second conductive layer GAT2 may have a single-layer or multi-layer structure, and for example, the second conductive layer GAT2 may have a single-layer structure including molybdenum (Mo).

The third conductive layer SD1 may include first to fifth bridge patterns BRP1 to BRP5 (or first to fifth connection patterns) and first to third sub-power lines PL_T1 to PL_T3.

The first bridge pattern BRP1 may overlap a first area of the second transistor T2, and may be electrically connected to the first area of the second transistor T2 through a contact hole CNT. Also, the first bridge pattern BRP1 may electrically connect the first data line D1 to the first area of the second transistor T2.

The second bridge pattern BRP2 may overlap each of a portion of the semiconductor layer ACT and the first capacitor electrode Cst_E1. The second bridge pattern BRP2 may be electrically connected to a portion of the semiconductor layer ACT through a contact hole exposing a portion of the semiconductor layer ACT, and may be electrically connected to each of an electrode of the third transistor T3 and an electrode of the fourth transistor T4. Also, the second bridge pattern BRP2 may be electrically connected to the first capacitor electrode Cst_E1 exposed by the second capacitor electrode Cst_E2.

The third bridge pattern BRP3 may overlap a first area of the fifth transistor T5, and may be electrically connected to the first area of the fifth transistor T5 through a contact hole. The third bridge pattern BRP3 may electrically connect the first area of the fifth transistor T5 to the first power line PL1.

The fourth bridge pattern BRP4 may overlap a second area of the sixth transistor T6, and may be electrically connected to the second area of the sixth transistor T6 through a contact hole. The fourth bridge pattern BRP4 may electrically connect the second area of the sixth transistor T6 to the first electrode ELT1 (see FIG. 4 or 6) through a sixth bridge pattern BRP6.

The fifth bridge pattern BRP5 may overlap each of the third power line PL3 and one end (or first end) of the semiconductor layer ACT. The fifth bridge pattern BRP5 may be electrically connected to the third power line PL3 through a contact hole, and may be electrically connected to one end (e.g., a second electrode of the fourth transistor T4) of the semiconductor layer ACT through a contact hole. For example, the fifth bridge pattern BRP5 may electrically connect the third power line PL3 to the second electrode of the fourth transistor T4.

The fourth power line PL4 may extend in the second direction DR2, and may be disposed at a side of the first pixel circuit area PXC1 in the first direction DR1 (or at an adjacent area between the first pixel circuit area PXC1 and the second pixel circuit areas PXC2). The fourth power line PL4 may overlap the seventh transistor T7 and may be electrically connected to an electrode of the seventh transistor T7 through a contact hole. The fourth power line PL4 may include a bent portion bypassing a first bridge pattern BRP1 to be spaced apart from the first bridge pattern BRP1 (e.g., the first bridge pattern BRP1 of the second pixel circuit area PXC2).

The fourth conductive layer SD2 may include a sixth bridge pattern BRP6 (or a sixth connection pattern), first to fourth data lines D1 to D4, and a first power line PL1.

The sixth bridge pattern BRP6 may overlap the fourth bridge pattern BRP4, and may be electrically connected to the fourth bridge pattern BRP4 through a contact hole. The sixth bridge pattern BRP6 may be electrically connected to the second area of the sixth transistor T6 through the fourth bridge pattern BRP4. Also, the sixth bridge pattern BRP6 may be electrically connected to the 1-1-th electrode ELT11 through a contact hole CNT_2. For example, the sixth bridge pattern BRP6 may electrically connect the second area of the sixth transistor T6 to the 1-1-th electrode ELT11 together with the fourth bridge pattern BRP4.

The first data line D1 may extend in the second direction DR2, may be disposed on the other side of the first pixel circuit area PXC1 in the first direction DR1, and may overlap the first bridge pattern BRP1. The first data line D1 may be electrically connected to the first bridge pattern BRP1 through a contact hole CNT_1, and may be electrically connected to the first area of the second transistor T2 through the first bridge pattern BRP1.

Similar to the first data line D1, the second data line D2 may extend in the second direction DR2, and may be disposed at the other side of the second pixel circuit area PXC2 in the first direction DR1 (or in an adjacent area between the first pixel circuit area PXC1 and the second pixel circuit area PXC2). According to embodiments, the second data line D2 may overlap the fourth power line PL4. The third data line D3 may extend in the second direction DR2, may be disposed at the other side of the third pixel circuit area PXC3 in the first direction DR1 (or at an adjacent area between the second pixel circuit area PXC2 and the third pixel circuit areas PXC3), and may overlap the fourth power line PL4.

The first power line PL1 may extend in the second direction DR2, and may be disposed between the first data line D1 and the second data line D2. The first power line PL1 may cover a lower configuration (e.g., the third transistor T3, the fourth transistor T4, and the first transistor T1) between the first data line D1 and the second data line D2.

The third conductive layer SD1 and the fourth conductive layer SD2 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The third conductive layer SD1 and the fourth conductive layer SD2 may have a single-layer or multi-layer structure, and for example, each of the third conductive layer SD1 and the fourth conductive layer SD2 may have a multi-layer structure of titanium/aluminum/titanium (Ti/Al/Ti).

Figure 6:
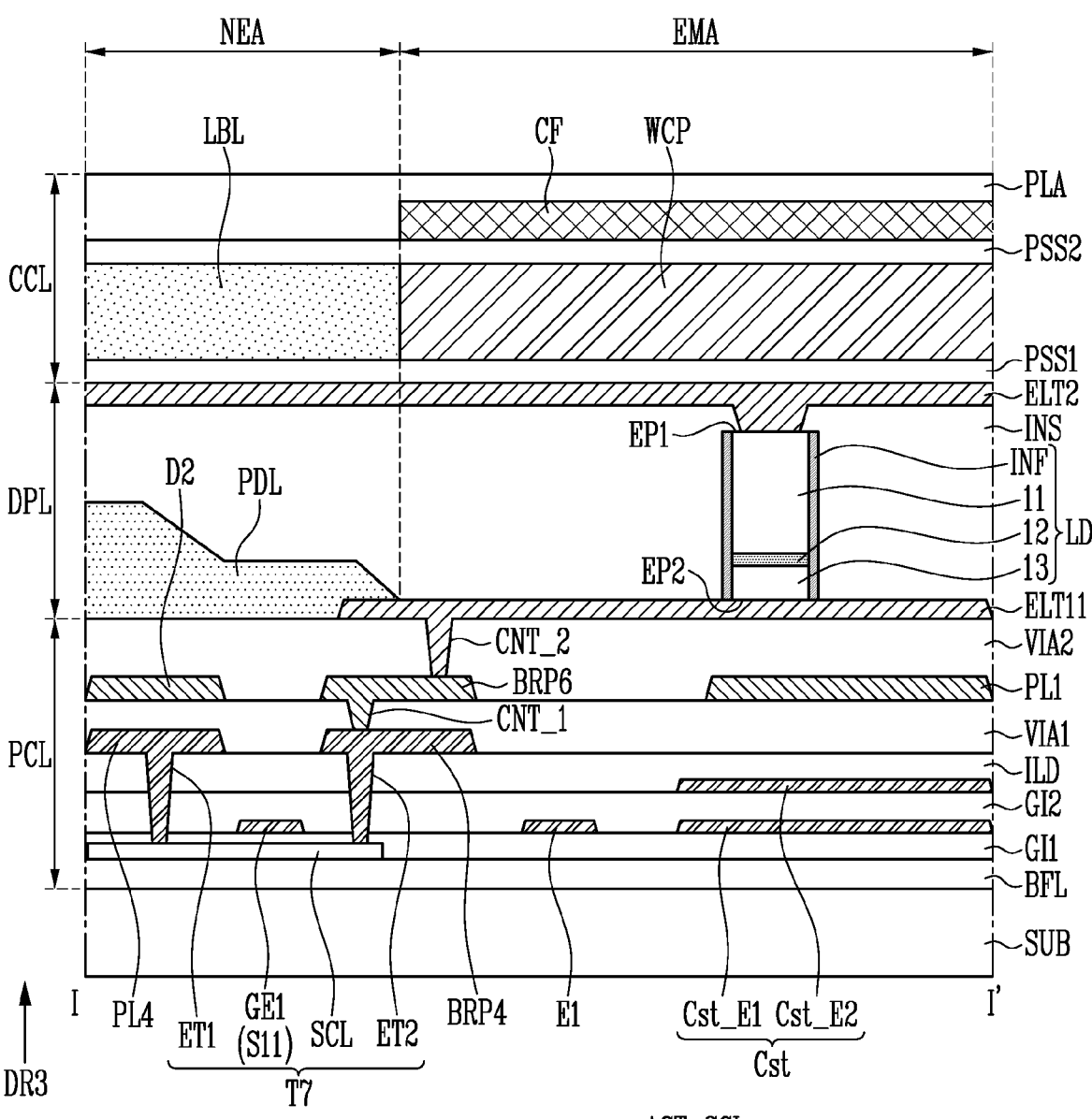
FIG. 6 is a cross-sectional view illustrating an embodiment of a pixel taken along line I-I' of FIG. 5.

FIG. 6 is a schematic cross-sectional view illustrating an embodiment of a pixel taken along line I-I' of FIG. 5. FIG. 6 illustrates a simple pixel, illustrating each electrode as an electrode of a single layer and insulating layers as only an insulating layer of a single layer, and the like, but the disclosure is not limited thereto. In addition, in an embodiment, unless otherwise stated, "formed and/or provided on a same layer" may refer to being formed in a same process, and "formed and/or provided on different layers" may refer to being formed in different processes.

Referring to FIGS. 5 and 6, the pixel circuit layer PCL and the display element layer DPL may be sequentially disposed on a substrate SUB.

The pixel circuit layer PCL may include a buffer layer BFL, a semiconductor layer ACT, a first insulating layer GI1 (or a first gate insulating layer), a first conductive layer GAT1, a second insulating layer GI2 (or a second gate insulating layer), a second conductive layer GAT2, a third insulating layer ILD (or an interlayer insulating layer), a third conductive layer SD1, a first planarization layer VIA1 (or a first via layer or a fourth insulating layer), a fourth conductive layer SD2, and a second planarization layer VIA2 (or a second via layer or a fifth insulating layer).

The buffer layer BFL, the semiconductor layer ACT, the first insulating layer GI1, the first conductive layer GAT1, the second insulating layer GI2, the second conductive layer GAT2, the third insulating layer ILD, the third conductive layer SD1, the first planarization layer VIA1, the fourth conductive layer SD2, and the second planarization layer VIA2 may be sequentially stacked on the substrate SUB. Since the semiconductor layer ACT, the first conductive layer GAT1, the second conductive layer GAT2, the third conductive layer SD1, and the fourth conductive layer SD2 have been described with reference to FIG. 5, repetitive descriptions shall not be repeated.

The substrate SUB may be made of an insulating material such as glass or resin. In addition, the substrate SUB may be formed of a material having flexibility so as to be bent or folded, and may have a single layer structure or a multi-layer structure. For example, the flexible material may include at least one of polystyrene, polyvinyl alcohol, polymethyl methacrylate, polyethersulfone, polyacrylate, polyether imide, polyetherimide, polyethylene naphthalate, polyethylene terephthalate, polyphenylene sulfide, polyarylate, polyimide, polycarbonate, triacetate cellulose, and cellulose acetate propionate. However, the material forming the substrate SUB is not limited to the above-described embodiments.

The buffer layer BFL may be disposed on an entire surface of the substrate SUB. The buffer layer BFL may prevent diffusion of impurity ions and may prevent penetration of moisture or external air. The buffer layer BFL may be an inorganic insulating layer including an inorganic material. The inorganic insulating layer may include, for example, at least one of silicon nitride ($SiN_x$), silicon oxide ($SiO_x$), silicon oxynitride (SiON), and metal oxide such as aluminum oxide ($AlO_x$). The buffer layer BFL may be provided as a single layer, but may also be provided as multiple layers having at least a double layer. In case that the buffer layer BFL is provided as multiple layers, each of the multiple layers may be formed of a same material or different materials. The buffer layer BFL may be omitted depending on materials and process conditions of the substrate SUB.

The semiconductor layer ACT may be disposed on the buffer layer BFL. The semiconductor layer ACT may be disposed between the buffer layer BFL and the first insulating layer GI1. The semiconductor layer ACT may include a semiconductor pattern SCL forming the seventh transistor T7. The semiconductor pattern SCL may include a first contact region contacting a first transistor electrode ET1, a second contact region contacting a second transistor electrode ET2, and a channel region disposed between the first and second contact regions. The semiconductor pattern SCL of the seventh transistor T7 may be a semiconductor pattern made of amorphous silicon, polysilicon, low-temperature polysilicon, or the like. However, the disclosure is not limited thereto, and the semiconductor pattern SCL of the seventh transistor T7 may be a semiconductor pattern including an oxide semiconductor. The channel region may be, for example, a semiconductor pattern that is not doped with impurities, and may be an intrinsic semiconductor. The first contact region and the second contact region may be semiconductor patterns doped with impurities.

The first insulating layer GI1 may be disposed on the semiconductor layer ACT. The first insulating layer GI1 may be an inorganic insulating layer including an inorganic material. For example, the first insulating layer GI1 and the buffer layer BFL may include a same material, or the first insulating layer GI1 may include one or more materials selected from materials that may be used to form the buffer layer BFL, e.g., as described herein. According to embodiments, the first insulating layer GI1 may be formed as an organic insulating layer including an organic material. The first insulating layer GI1 may be provided as a single layer, or may be provided as a multi-layer having at least a double layer.

The first conductive layer GAT1 may be disposed on the first insulating layer GI1. As described with reference to FIG. 5, the first conductive layer GAT1 may include a gate electrode GE1 (or the 11-th scan line S11), the first light emitting control line E1, and the first capacitor electrode Cst_E1. The 11-th scan line S11 may overlap the channel region of the seventh transistor T7, and may form the gate electrode GE1 of the seventh transistor T7.

The second insulating layer GI2 may be disposed on the first insulating layer GI1 and the first conductive layer GAT1. The second insulating layer GI2 may be generally disposed over the entire surface of the substrate SUB. The second insulating layer GI2 and the first insulating layer GI1 may include a same material, or the second insulating layer GI2 may include one or more materials selected from materials that may be used to form the first insulating layer GI1, e.g., as described herein.

The second conductive layer GAT2 may be disposed on the second insulating layer GI2. As described with reference to FIG. 5, the second conductive layer GAT2 may include the second capacitor electrode Cst_E2. The second capacitor electrode Cst_E2 may overlap the first capacitor electrode Cst_E1 (e.g., in a plan view), and may form the storage capacitor Cst together with the first capacitor electrode Cst_E1.

The third insulating layer ILD may be disposed on the second insulating layer GI2 and the second conductive layer GAT2. The third insulating layer ILD may be generally disposed over the entire surface of the substrate SUB. The third insulating layer ILD and the first insulating layer GI1 may include a same material, or the third insulating layer ILD may include one or more materials selected from materials that may be used to form the first insulating layer GI1, e.g., as described herein.

The third conductive layer SD1 may be disposed on the third insulating layer ILD. As described with reference to FIG. 5, the third conductive layer SD1 may include a fourth bridge pattern BRP4 and a fourth power line PL4.

The fourth power line PL4 may overlap one region of the semiconductor pattern SCL, may be electrically connected to one region of the semiconductor pattern SCL through a contact hole penetrating the first insulating layer GI1, the second insulating layer GI2, and the third insulating layer ILD, and may form the first transistor electrode ET1 of the seventh transistor T7.

The fourth bridge pattern BRP4 may overlap another region of the semiconductor pattern SCL, may be electrically connected to another region of the semiconductor pattern SCL through a contact hole penetrating the first insulating layer GI1, the second insulating layer GI2, and the third insulating layer ILD, and may form the second transistor electrode ET2 of the seventh transistor T7.

The first planarization layer VIA1 may be disposed on the third insulating layer ILD and the third conductive layer SD1. The first planarization layer VIA1 may be generally disposed over the entire surface of the substrate SUB.

The first planarization layer VIA1 may include an organic insulating material such as polyacrylates resin, epoxy resin, phenolic resin, polyamides resin, polyimides rein, unsaturated polyesters resin, polyphenyleneethers resin, polyphenylenesulfides resin, or benzocyclobutene (BCB).

The fourth conductive layer SD2 may be disposed on the first planarization layer VIA1. The fourth conductive layer SD2 may include a sixth bridge pattern BRP6, a second data line D2, and a first power line PL1.

The sixth bridge pattern BRP6 may overlap the fourth bridge pattern BRP4, and may be electrically connected to the fourth bridge pattern BRP4 through a contact hole CNT_1 penetrating the first planarization layer VIA1.

The second data line D2 may overlap the fourth power line PL4.

The first power line PL1 may be spaced apart from the sixth bridge pattern BRP6 and the second data line D2. The first power line PL1 may be disposed in most of remaining areas except for the sixth bridge pattern BRP6 and the second data line D2 to cover (or overlap) the lower component (e.g., the storage capacitor Cst).

The second planarization layer VIA2 may be disposed on the first planarization layer VIA1 and the fourth conductive layer SD2. The second planarization layer VIA2 may be generally disposed over the entire surface of the substrate SUB. The second planarization layer VIA2 and the first planarization layer VIA1 may include a same material, or the second planarization layer VIA2 may include one or more materials selected from materials that may be used to form the first planarization layer VIA1, e.g., as described herein.

The display element layer DPL may be provided on the second planarization layer VIA2.

The display element layer DPL may include a 1-1-th electrode ELT11, a pixel defining layer PDL, a light emitting element LD (or light emitting elements), an insulating layer INS, and a second electrode ELT2. The 1-1-th electrode ELT11, the pixel defining layer PDL, the light emitting element LD, the insulating layer INS, and the second electrode ELT2 may be sequentially disposed or formed on the second planarization layer VIA2 (or the pixel circuit layer PCL).

The 1-1-th electrode ELT11 may be disposed on the second planarization layer VIA2. The 1-1-th electrode ELT11 may be disposed to correspond to a light emitting area EMA (see FIG. 7) of each pixel. In an embodiment, the 1-1-th electrode ELT11 may be an anode electrode.

The 1-1-th electrode ELT11 may be electrically connected to the sixth bridge pattern BRP6 through a contact hole CNT_2 penetrating through the second planarization layer VIA2 and exposing the sixth bridge pattern BRP6. The 1-1-th electrode ELT11 may be electrically connected to the second transistor electrode ET2 of the seventh transistor T7 through the sixth bridge pattern BRP6 and the fourth bridge pattern BRP4.

Figure 7:
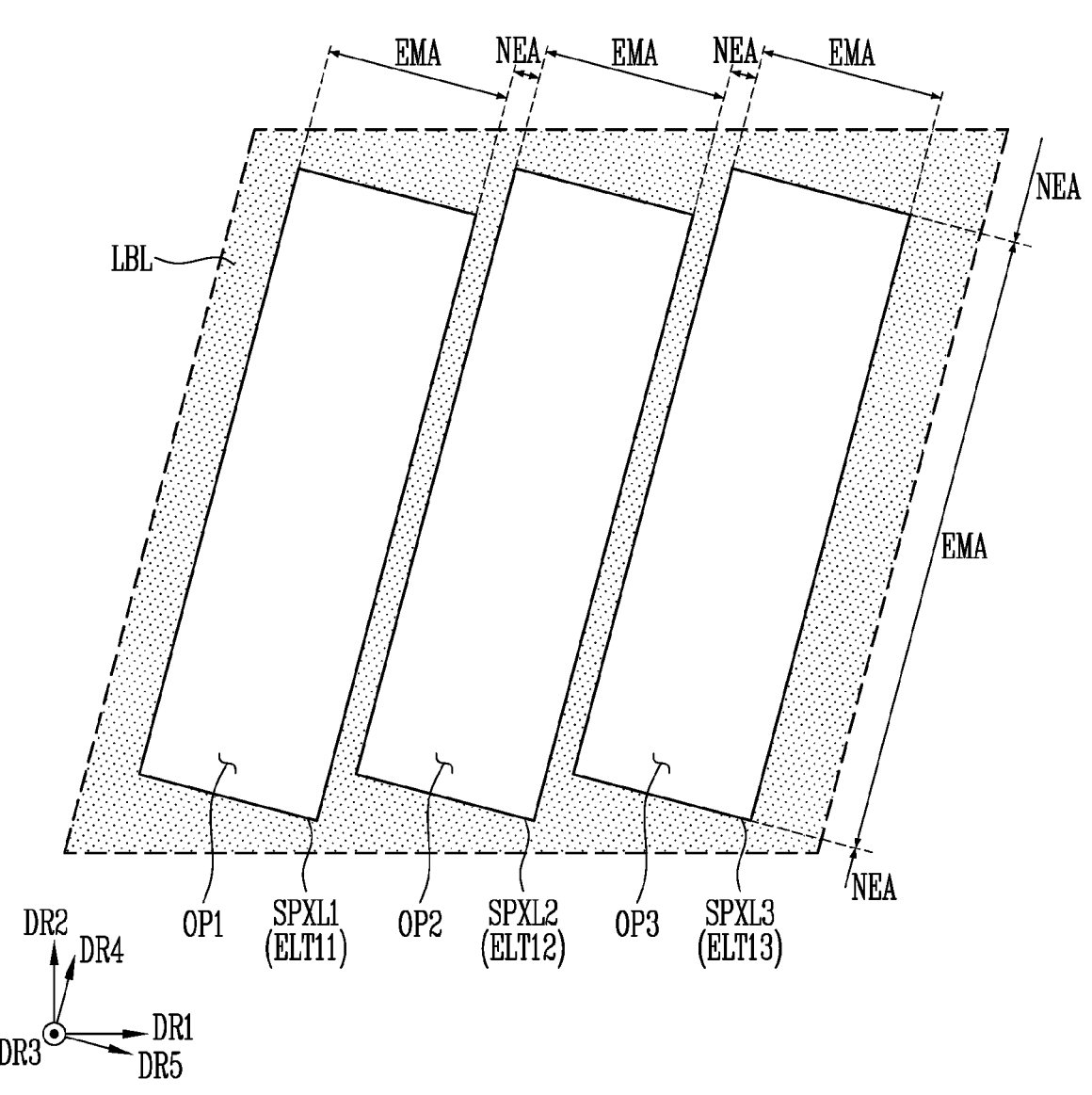
FIGS. 7 to 8B are schematic enlarged views of EA1 of FIG. 2.

The pixel defining layer PDL may be disposed or formed on the second planarization layer VIA2 and the 1-1-th electrode ELT11 in a non-light emitting area NEA (see FIG. 7). The pixel defining layer PDL may partially overlap an edge of the 1-1-th electrode ELT11 in the non-light emitting area NEA.

According to embodiments, the pixel defining layer PDL may further include a spacer in the non-light emitting area NEA. The spacer may protrude from the pixel defining layer PDL in the third direction DR3 in the non-light emitting area NEA, and may separate a mask, used in the manufacturing process of the display device DD (see FIG. 1), from the pixel circuit layer PCL (or the display element layer DPL).

The light emitting element LD may be disposed on the 1-1-th electrode ELT11 in the light emitting area EMA. The light emitting element LD may include a second semiconductor layer 13 that contacts or electrically connected to the 1-1-th electrode ELT11, an active layer 12 disposed on the second semiconductor layer 13, and a first semiconductor layer 11 that is disposed on the active layer 12 and electrically connected to the second electrode ELT2. The light emitting element LD may emit light while electron-hole pairs are combined in the active layer 12.

The light emitting element LD may be included in each of the first to third sub-pixels SPXL1, SPXL2, and SPXL3 (see FIG. 7). The light emitting element LD may be configured to emit light. The light emitting element LD may include a first semiconductor layer 11, a second semiconductor layer 13, and an active layer 12 interposed between the first and second semiconductor layers 11 and 13. For example, in case that an extending direction of the light emitting element LD is referred to as a length direction, the light emitting element LD may include the first semiconductor layer 11, the active layer 12, and the second semiconductor layer 13 sequentially stacked in the length direction.

According to an embodiment, the light emitting element LD may be provided in a column shape extending in a direction. The light-emitting element LD may have a first end EP1 and a second end EP2. One of the first and second semiconductor layers 11 and 13 may be adjacent to a first end EP1 of the light emitting element LD. The other of the first and second semiconductor layers 11 and 13 may be adjacent to a second end EP2 of the light emitting element LD.

According to an embodiment, the light emitting element LD may be a light emitting element manufactured in a column shape by an etching method or the like. In this specification, "column shape" refers to a rod-like shape or a bar-like shape that is long in the length direction (for example, having an aspect ratio greater than 1), such as a circular column or a polygonal column, and a shape of a cross-section thereof is not particularly limited. For example, a length of the light emitting element LD may be greater than a diameter (or width of a cross-section) thereof.

According to an embodiment, the light emitting element LD may have a size to a degree of the nanometer scale to the micrometer scale. For example, each of the light emitting elements LD may have a diameter (or width) and/or a length in a nanoscale to microscale range. However, the size of the light emitting element LD is not limited thereto.

The first semiconductor layer 11 may be a semiconductor layer of a first conductivity type. For example, the first semiconductor layer 11 may include an N-type semiconductor layer. For example, the first semiconductor layer 11 may include at least one semiconductor material of InAlGaN, GaN, AlGaN, InGaN, AlN, and InN, and may include an N-type semiconductor layer doped with a first conductive dopant such as Si, Ge, Sn, and the like. However, the material forming the first semiconductor layer 11 is not limited thereto.

The active layer 12 may be disposed on the first semiconductor layer 11, and may have a single or multiple quantum well structure. For example, in case that the active layer 12 is formed in a multiple quantum well structure, the active layer 12 may have a structure that a barrier layer (not shown), a strain reinforcing layer, and a well layer are periodically stacked as a unit or part. Since the strain reinforcing layer has a smaller lattice constant than the barrier layer, it may further strengthen a strain applied to the well layer, for example, a compression strain. However, the structure of the active layer 12 is not limited to the above-described embodiment.

According to an embodiment, the active layer 12 may emit light having a wavelength of about 400 nm to about 900 nm. According to an embodiment, the active layer 12 may include a material such as AlGaN or InAlGaN, but is not limited to the above-described example.

The second semiconductor layer 13 may be disposed on the active layer 12, and may include a semiconductor layer of a different type from the first semiconductor layer 11. For example, the second semiconductor layer 13 may include a P-type semiconductor layer. For example, the second semiconductor layer 13 may include at least one semiconductor material of InAlGaN, GaN, AlGaN, InGaN, AlN, and InN, and may include a P-type semiconductor layer doped with a second conductive dopant such as Mg and the like. However, the material forming the second semiconductor layer 13 is not limited thereto, and various other materials may form the second semiconductor layer 13.

In case that a threshold voltage or more is applied to opposite ends of the light-emitting element LD, the light-emitting element LD emits light while electron-hole pairs are coupled in the active layer 12. The light-emitting element LD may be used as a light source of various light-emitting elements, including the pixel of the display device by controlling light emitting of light-emitting element LD using this principle.

According to embodiments, the light emitting element LD may further include an insulating film INF provided on a surface thereof. The insulating film INF may be formed as a single layer or a double layer, but is not limited thereto, and may include more layers. For example, the insulating film INF may include a first insulating layer including a first material and a second insulating layer including a second material different from the first material.

According to an embodiment, the insulating film INF may expose ends of the light emitting element LD having different polarities. For example, the insulating film INF may expose one end of each of the first and second semiconductor layers 11 and 13 disposed at the first and second ends EP1 and EP2 of the light-emitting element LD.

According to an embodiment, the insulating film INF may include an inorganic material. For example, the insulating film INF may be composed of a single layer or multiple layers including at least one insulating material selected from silicon oxide $(SiO_x)$, silicon nitride $(SiN_x)$, silicon oxynitride $(SiO_xN_y)$, aluminum oxide $(AlO_x)$, and titanium oxide $(TiO_x)$, but is not limited thereto.

According to an embodiment, the insulating film INF may secure electrical stability of the light emitting element LD. In addition, even in case that light emitting elements LD are disposed close to each other, it is possible to prevent an unwanted short circuit between the light emitting elements LD.

According to an embodiment, the light emitting element LD may further include an additional configuration other than the above-described configuration. For example, the light-emitting element LD may include at least one phosphor layer, an active layer, a semiconductor layer and/or an electrode layer that are disposed on one end side of the first semiconductor layer 11, the active layer 12 and/or the second semiconductor layer 13. For example, a contact electrode layer may be further disposed on each of the first and second ends EP1 and EP2 of the light emitting element LD.

The insulating layer INS (or the planarization layer) may be entirely provided on the substrate SUB to cover the pixel defining layer PDL, the first electrode ELT1, and the light emitting element LD. The insulating layer INS may be provided to fill a space between the pixel defining layer PDL and the light emitting element LD and a space between the light emitting element LD and an adjacent light emitting element. The insulating layer INS may prevent a side surface of the light emitting element LD from contacting another conductive material (e.g., the second electrode ELT2). In addition, the insulating layer INS may cover the 1-1-th electrode ELT11 to prevent an electrical short circuit between the 1-1-th electrode ELT11 and the second electrode ELT2. To this end, the insulating layer INS may include an insulating material including an organic material.

A contact hole exposing the first semiconductor layer 11 of the light emitting element LD may be formed in the insulating layer INS. However, the disclosure is not limited thereto. For example, the thickness of the insulating layer INS may be smaller than or equal to the thickness of the light emitting element LD in the third direction DR3, and the insulating layer INS may expose the first semiconductor layer 11.

The second electrode ELT2 (or a common electrode) may be provided and/or formed on the insulating layer INS (and the light emitting element LD). The second electrode ELT2 may be electrically connected to the first semiconductor layer 11 of the light emitting element LD through a contact hole, or may be directly electrically connected to the first semiconductor layer 11 of the light emitting element LD.

The second electrode ELT2 may be provided or disposed on the pixel defining layer PDL, and the second electrode ELT2 may be provided entirely on the substrate SUB. The second electrode ELT2 may be a common layer provided in common to the pixel and adjacent pixels (e.g., the first to third sub-pixels SPXL1 to SPXL3 illustrated in FIG. 7). In an embodiment, the second electrode ELT2 may be a cathode electrode. The second electrode ELT2 may be electrically connected to a second driving power VSS (see FIG. 4) so that a voltage of the second driving power VSS may be transferred to the second electrode ELT2.

The second electrode ELT2 may be formed of various transparent conductive materials (or substances) so that light emitted from the light emitting element LD proceeds in the third direction DR3 without loss. For example, the second electrode ELT2 may include at least one of various transparent conductive materials (or substance) including indium tin oxide (ITO), indium zinc oxide (IZO), zinc oxide (ZnO), indium gallium zinc oxide (IGZO), indium tin zinc oxide (ITZO), or the like, and may be configured to be substantially transparent or semi-transparent to satisfy a transmittance (or predetermined or selected transmittance). However, the material of the second electrode ELT2 is not limited to the above-described embodiment.

According to an embodiment, an encapsulation layer may be provided and/or formed on the second electrode ELT2. The encapsulation layer may be provided in a form including an organic insulating layer, an inorganic insulating layer, or an organic insulating layer disposed on the inorganic insulating layer. The encapsulation layer may be formed of a transparent insulating material to minimize loss of light proceeding in the third direction DR3.

According to an embodiment, a color conversion layer CCL may be stacked on the display element layer DPL.

The color conversion layer CCL may include a first passivation layer PSS1, a light blocking layer LBL, a wavelength conversion pattern WCP, a second passivation layer PSS2, a color filter CF, and a planarization layer PLA.

The first passivation layer PSS1 may be disposed between the display element layer DPL and the color conversion layer CCL. The first passivation layer PSS1 may seal (or cover) the light blocking layer LBL and the wavelength conversion pattern WCP.

The wavelength conversion pattern WCP may be disposed on the display element layer DPL overlapping the light emitting area EMA in the third direction DR3. The wavelength conversion pattern WCP may change the wavelength (or color) of light emitted from the display element layer DPL by using quantum dots. The wavelength conversion pattern WCP may be formed on a base surface on which the display element layer DPL is provided by a continuous process, or may be formed by an adhesion process using an adhesive layer.

For example, the quantum dots may be disposed on the light emitting element LD, and may convert light, emitted from the light emitting element LD, into light of a specific color. For example, in case that a pixel (e.g., the first sub-pixel SPXL1 see FIG. 7) is a red pixel, the wavelength conversion pattern WCP may include color conversion particles of a red quantum dot that converts light (or light of a first color), emitted from the light emitting element LD, into red light (or light of a second color). In addition, in case that the pixel (e.g., the second sub-pixel SPXL2) is a green pixel, the wavelength conversion pattern WCP may include color conversion particles of a green quantum dot that converts the light, emitted from the light emitting element LD, into green light (or light of a third color). Additionally, in case that the pixel (e.g., the third sub-pixel SPXL3) is a blue pixel, the wavelength conversion pattern WCP may include color conversion particles of a blue quantum dot that converts the light, emitted from the light emitting element LD, into blue light (or light of a fourth color). According to an embodiment, the wavelength conversion pattern WCP may include light scattering particles instead of the color conversion particles. For example, in case that the light emitting element LD emits blue-based light, the wavelength conversion pattern WCP of the third sub-pixel SPXL3 may include light scattering particles. The above-described light scattering particles may be omitted according to embodiments.

The second passivation layer PSS2 may be disposed on the light blocking layer LBL and the wavelength conversion pattern WCP. The second passivation layer PSS2 may seal, cover, or overlap the light blocking layer LBL and the wavelength conversion pattern WCP.

The color filter CF may include a color filter material that selectively transmits light of a specific color converted by the color conversion particles. In case that the pixel (e.g., the first sub-pixel SPXL1) is the red pixel, the color filter CF may include a red color filter. Also, in case that the pixel (e.g., the second sub-pixel SPXL2) is the green pixel, the color filter CF may include a green color filter. Also, in case that the pixel (e.g., the third sub-pixel SPXL3) is the blue pixel, the color filter CF may include a blue color filter.

The planarization layer PLA may be disposed on the color filter CF. The planarization layer PLA may cover the color filter CF. Also, the planarization layer PLA may cancel a step difference caused by the color filter CF.

Hereinafter, a positional relationship between the light emitting element LD and the sub-pixels SPXL1, SPXL2, and SPXL3 of the display device DD according to the embodiment will be described with reference to FIGS. 7 to 11B. Descriptions that may overlap with the above will be briefly described or omitted.

Figure 8A:
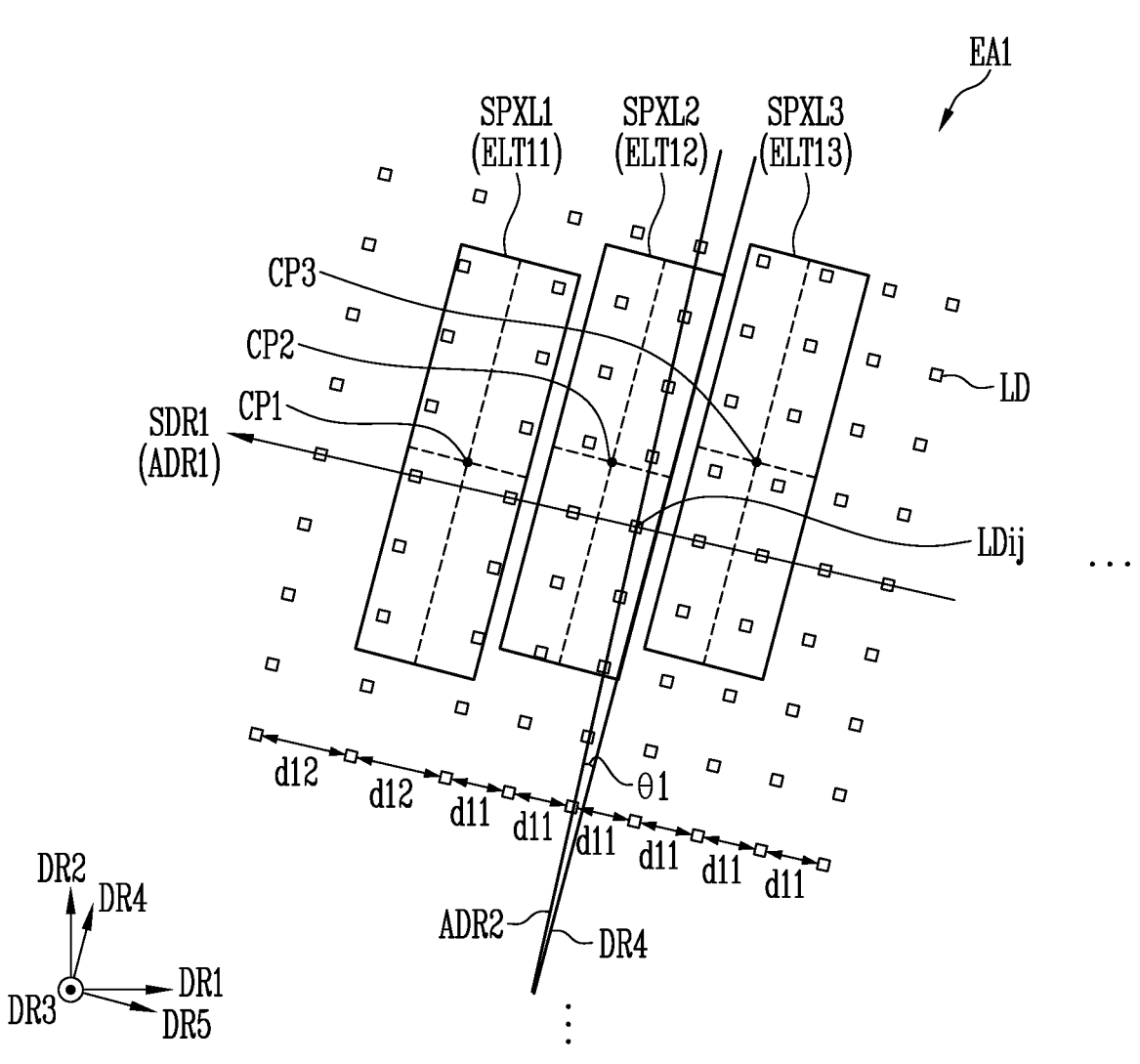
Figure 8B:
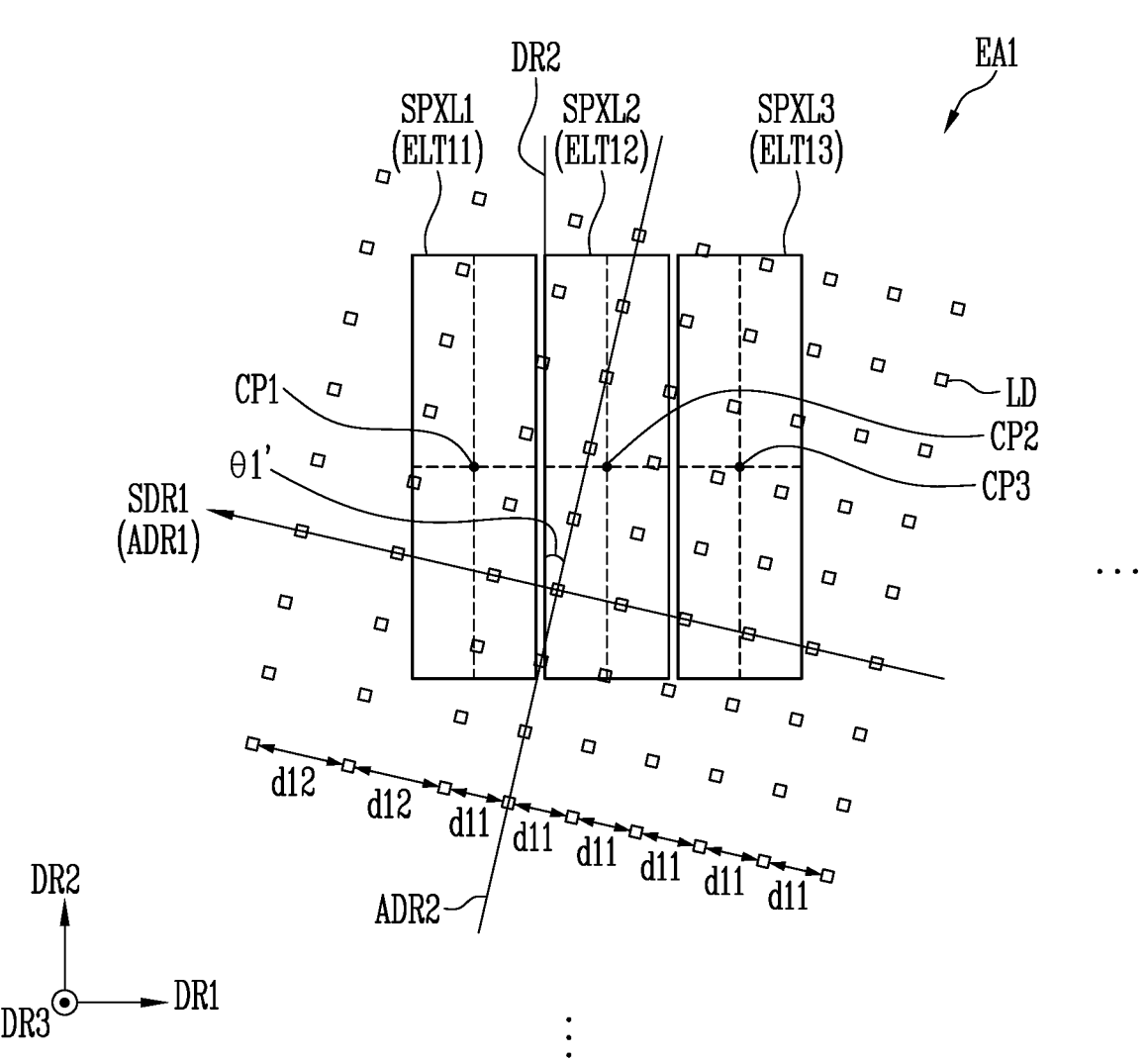

FIGS. 7 to 8B are schematic enlarged views of area EA1 of FIG. 2. FIG. 7 illustrates area EA1, centering on the light emitting areas of the sub-pixels SPXL1, SPXL2, and SPXL3. FIGS. 8A and 8B illustrate area EA1, centering on the arrangement of the light emitting elements LD included in the sub-pixels SPXL1, SPXL2, and SPXL3.

Referring to FIG. 7, positions of the first to third sub-pixels SPXL1, SPXL2, and SPXL3 may be defined by the light blocking layer LBL disposed on the display element layer DPL (see FIG. 6).

For example, an area in which the light blocking layer LBL is not disposed may be the light emitting area EMA in which the light emitted from the first to third sub-pixels SPXL1, SPXL2, and SPXL3 is provided to the outside. An area in which the light blocking layer LBL is disposed may be a non-light emitting area NEA in which the light emitted from the first to third sub-pixels SPXL1, SPXL2, and SPXL3 is not substantially provided to the outside.

According to an embodiment, the light blocking layer LBL may include a first opening OP1, a second opening OP2, and a third opening OP3. The first opening OP1, the second opening OP2, and the third opening OP3 may be areas in which the light blocking layer LBL is not disposed. According to an embodiment, the position of the first opening OP1 may correspond to the 1-1-th electrode ELT11 (or the first anode) of the first sub-pixel SPXL1, the position of the second opening OP2 may correspond to the 1-2-th electrode ELT12 (or the second anode) of the second sub-pixel SPXL2, and the position of the third opening OP3 may correspond to the 1-3-th electrode ELT13 (or the third anode) of the third sub-pixel SPXL3.

At least a portion of the light blocking layer LBL may be provided to surround the first sub-pixel SPXL1 to form the first opening OP1. In this case, the first opening OP1 may refer to the light emitting area EMA of the first sub-pixel SPXL1. According to the embodiment, the wavelength conversion pattern (not shown) disposed at a position corresponding to the first opening OP1 may include color conversion particles of the red quantum dot that converts light (or light of the first color), emitted from the light emitting element LD included in the first sub-pixel SPXL1, into light of the red color (or light of the second color).

At least a portion of the light blocking layer LBL may be provided to surround the second sub-pixel SPXL2 to form the second opening OP2. In this case, the second opening OP2 may refer to the light emitting area EMA of the second sub-pixel SPXL2. According to the embodiment, the wavelength conversion pattern (not shown) disposed at a position corresponding to the second opening OP2 may include color conversion particles of the green quantum dot that converts light (or light of the first color), emitted from the light emitting element LD included in the second sub-pixel SPXL2, into light of the green color (or light of the third color).

At least a portion of the light blocking layer LBL may be provided to surround the third sub-pixel SPXL3 to form the third opening OP3. In this case, the third opening OP3 may refer to the light emitting area EMA of the third sub-pixel SPXL3. According to the embodiment, the wavelength conversion pattern (not shown) disposed at a position corresponding to the third opening OP3 may include color conversion particles of the blue quantum dot that converts light (or light of the first color), emitted from the light emitting element LD included in the third sub-pixel SPXL3, into light of the blue color (or light of the fourth color). According to an embodiment, the wavelength conversion pattern may include light scattering particles instead of the color conversion particles. For example, in case that the light emitting element LD included in the third sub-pixel SPXL3 emits blue-based light, the wavelength conversion pattern of the third sub-pixel SPXL3 may include light scattering particles.

According to an embodiment, the first to third sub-pixels SPXL1, SPXL2, and SPXL3 may extend in a fourth direction DR4, and may be spaced apart from each other in the fifth direction DR5. According to an embodiment, the first sub-pixel SPXL1 may be disposed on a side of the second sub-pixel SPXL2, and the third sub-pixel SPXL3 may be disposed on another side of the second sub-pixel SPXL2. The fourth direction DR4 and the fifth direction DR5 may intersect each other. The fourth direction DR4 and the fifth direction DR5 may be non-parallel to each other. According to an embodiment, the fourth direction DR4 and the fifth direction DR5 may be perpendicular to each other.

Referring to FIG. 8A, the 1-1-th electrode ELT11 (or the first anode) of the first sub-pixel SPXL1 may be formed by rotating an angle (or predetermined or selected angle) in a clockwise direction with respect to a first center point CP1. The 1-2-th electrode ELT12 (or the second anode) of the second sub-pixel SPXL2 may be formed by rotating by an angle in a clockwise direction with respect to a second center point CP2. Also, the 1-3-th electrode ELT13 (or the third anode) of the third sub-pixel SPXL3 may be formed by rotating by an angle in a clockwise direction with respect to a third center point CP3.

Accordingly, each of the 1-1-th electrode ELT11 (or the first anode) of the first sub-pixel SPXL1, the 1-2-th electrode ELT12 (or the second anode) of the second sub-pixel SPXL2, and the 1-3-th electrodes ELT13 (or the third anode) of the third sub-pixel SPXL3 may extend in the fourth direction DR4, and may be disposed to be spaced apart from each other in the fifth direction DR5.

The light emitting elements LD may be arranged in a matrix form. The light emitting elements LD may be disposed according to a matrix form defined by a row direction extending in a first arrangement direction ADR1 and a column direction extending in a second arrangement direction ADR2. The first arrangement direction ADR1 and the second arrangement direction ADR2 may intersect each other. The first arrangement direction ADR1 and the second arrangement direction ADR2 may be non-parallel to each other. According to an embodiment, the first arrangement direction ADR1 and the second arrangement direction ADR2 may be perpendicular to each other.

According to an embodiment, the light emitting element LD may be arranged at positions corresponding to each row and column in the matrix form. An ij-th light emitting element LDij may refer to the light emitting elements LD arranged in an i-th row and a j-th column in the matrix form. For example, a light emitting element LD may be disposed in a fifth column of a fifth row.

According to an embodiment, the display device DD shown in FIG. 2 may include a display area DA and a non-display area NDA surrounding the display area DA. A first arrangement distance d12 between the light emitting elements LD in an outer portion of the display area DA may be greater than a second arrangement distance d11 between the light emitting elements LD in a central portion of the display area DA. For example, in case that the display area DA has a rectangular shape, the outer portion may correspond to vertex areas (e.g., areas EA1, EA2, EA3, and EA4) of the rectangular shape of FIG. 2.

As will be described below with reference to FIG. 21, the light emitting elements LD may be disposed on a donor film 16 in the matrix form including a row direction extending in the first arrangement direction ADR1 and a column direction extending in the second arrangement direction ADR2. The donor film 16 may be an isotropically stretchable film. The donor film 16 having an area smaller than that of the substrate SUB (see FIG. 2) may be stretched in the first arrangement direction ADR1 and the second arrangement direction ADR2 to cover the substrate SUB. In this case, since a main stretching direction SDR1 is the first arrangement direction ADR1 in the area EA1, the first arrangement distance d12 between the light emitting elements LD may be greater than the second arrangement distance d11.

As the embodiment shown in FIG. 8A, in case that the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 are rotated by an angle in the clockwise direction to correspond to the stretching direction of the donor film 16 (see FIG. 20), the number (e.g., twelve) of the light emitting elements LD disposed on the 1-1-th electrode ELT11 (or the first anode) of the first sub-pixel SPXL1 may be substantially the same as the number (e.g., twelve) of the light emitting elements LD disposed on the 1-2-th electrode ELT12 (or the second anode) of the second sub-pixel SPXL2 and the 1-3-th electrode ELT13 (or the third anode) of the third sub-pixel SPXL3, or may be smaller than or equal to a difference (e.g., a predetermined or selected difference). In this case, the fourth direction DR4 and the second arrangement direction ADR2 may be non-parallel to each other. For example, the fourth direction DR4 and the second arrangement direction ADR2 may form an angle $\theta 1$ of an acute angle.

On the other hand, as shown in FIG. 8B, in case that the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 are spaced apart from each other in the first direction DR1 and extend in the second direction DR2, the number (e.g., seven) of the light emitting elements LD disposed on the 1-1-th electrode ELT11 (or the first anode) of the first sub-pixel SPXL1 may be smaller than the number (e.g., eleven) of the light emitting elements LD disposed on the 1-2-th electrode ELT12 (or the second anode) of the second sub-pixel SPXL2 and the 1-3-th electrode ELT13 (or the third anode) of the third sub-pixel SPXL3. Even in the embodiment of FIG. 8B, the fourth direction DR4 and the second arrangement direction ADR2 may be non-parallel to each other. For example, the fourth direction DR4 and the second arrangement direction ADR2 may form an angle $\theta 1'$ of an acute angle. In this case, the angle $\theta 1'$ in FIG. 8B may be greater than the angle $\theta 1$ in FIG. 8A.

According to an embodiment, the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 may be formed by rotating in the clockwise direction by an angle (e.g., a predetermined or selected angle) with respect to the first to third center points CP1, CP2, and CP3, respectively. In this case, the angle may be designed to increase as the first arrangement distance d12 is greater than the second arrangement distance d11. However, the angle may increase until the extension direction (e.g., the fourth direction DR4) of the sub-pixels SPXL1, SPXL2, and SPXL3 coincides with the second arrangement direction ADR2 of the light emitting element LD.

The light emitting element LD may have a rectangular shape (or a square shape) in a plan view. For example, in case that the light emitting element LD has a rectangular parallelepiped shape, it may be provided in a rectangular shape (or a square shape) in a plan view. Although not shown, the light emitting element LD may have a circular shape in a plan view. For example, in case that the light emitting element LD is provided in the form of a column having a circular bottom, it may be provided in a circular shape in a plan view. However, the shape of the light emitting element LD is not limited to the above-described example, and according to the embodiment, the light emitting element LD having various bottom shapes may be provided.

Figure 9A:
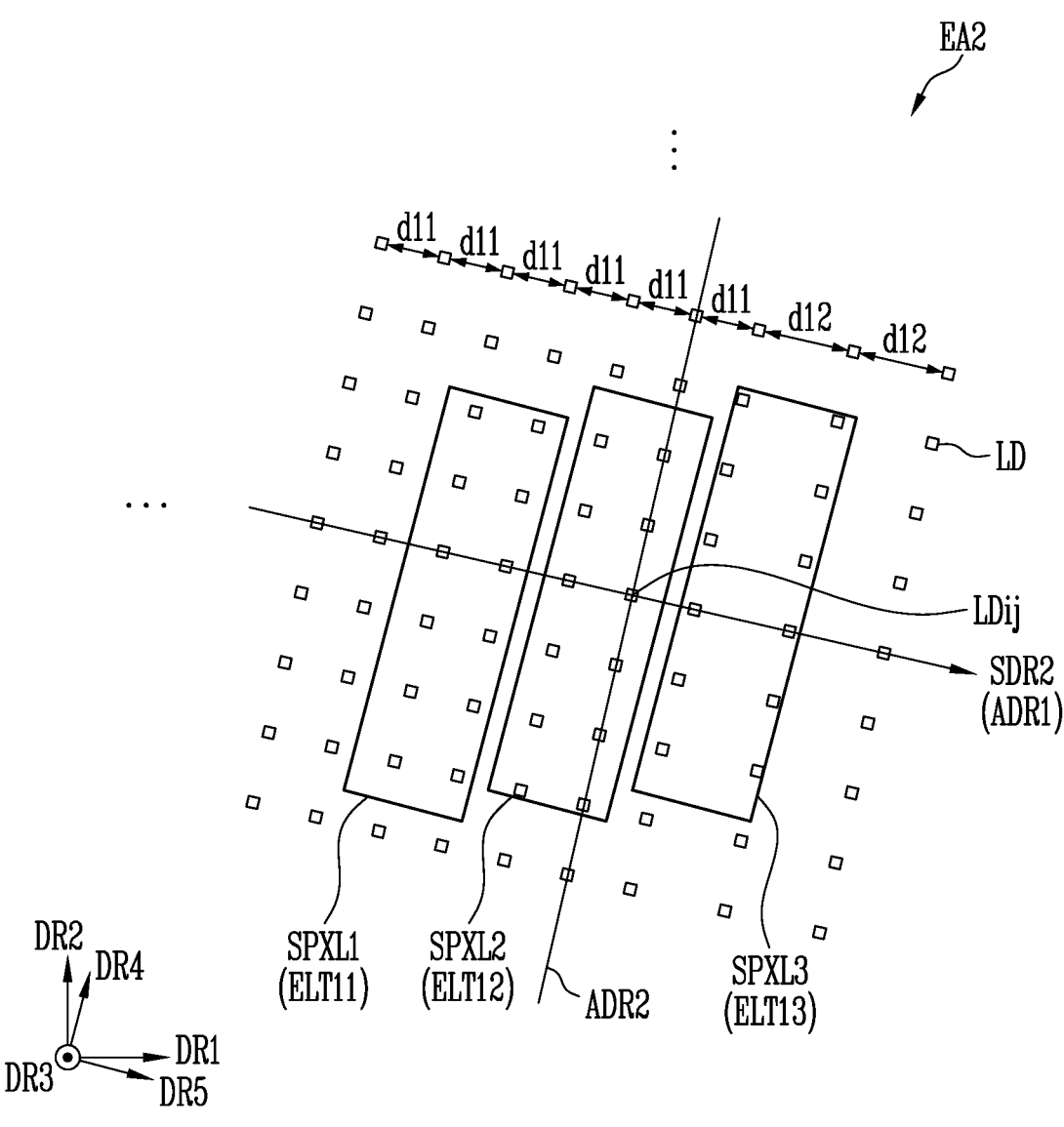
FIGS. 9A and 9B are schematic enlarged views of EA2 of FIG. 2.
Figure 9B:
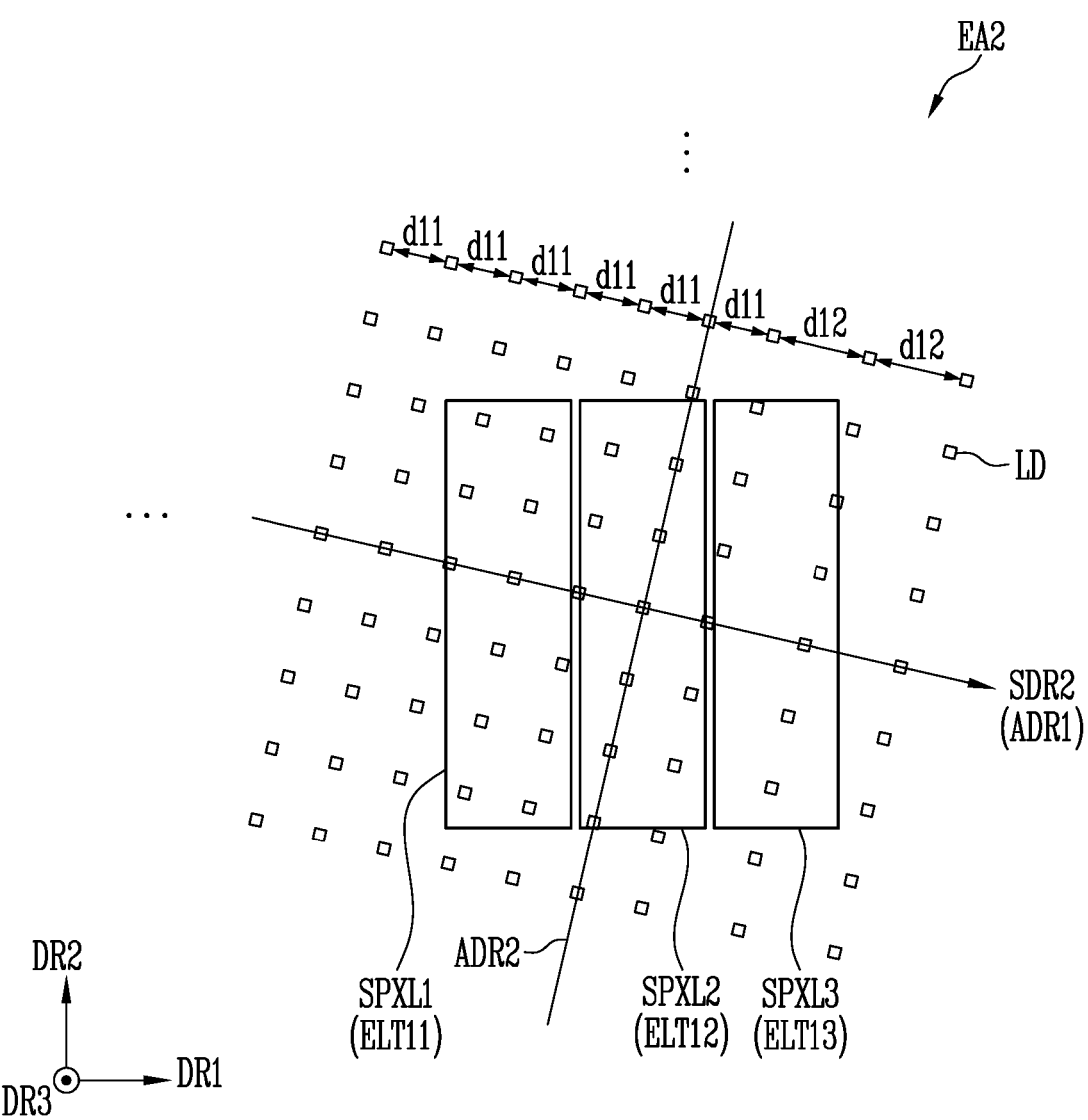
Figure 10A:
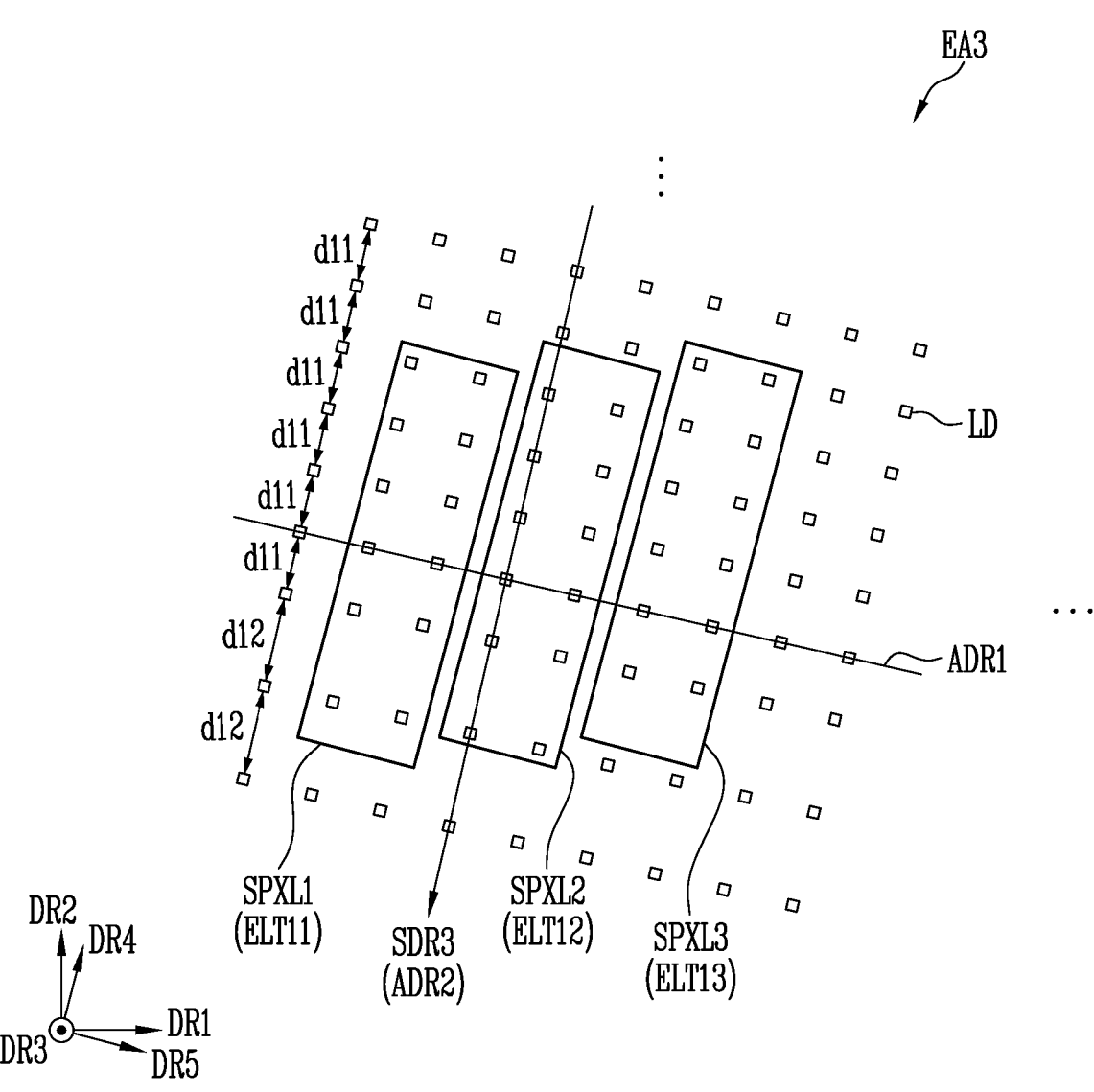
FIGS. 10A and 10B are schematic enlarged views of EA3 of FIG. 2.
Figure 10B:
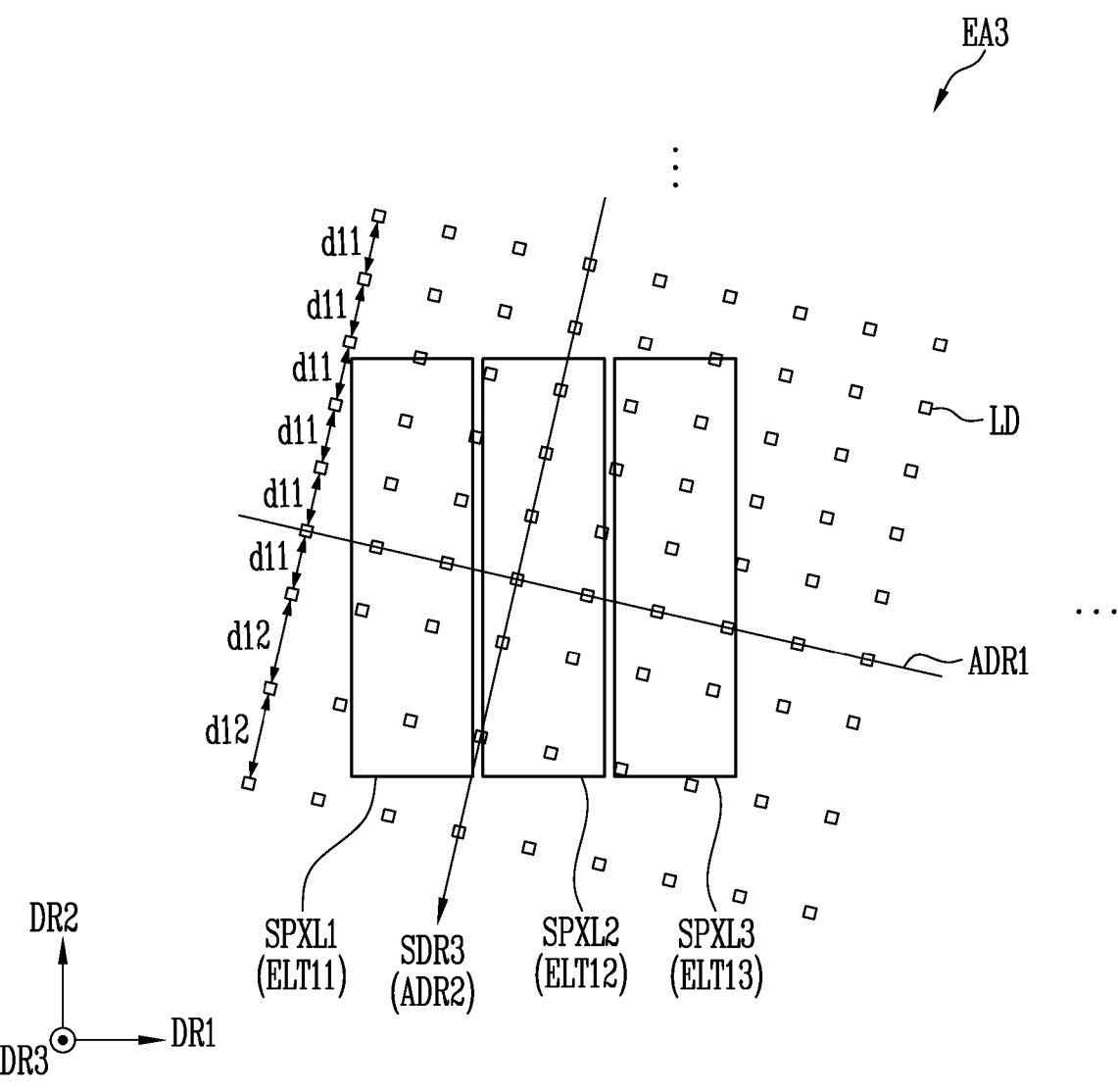
Figure 11A:
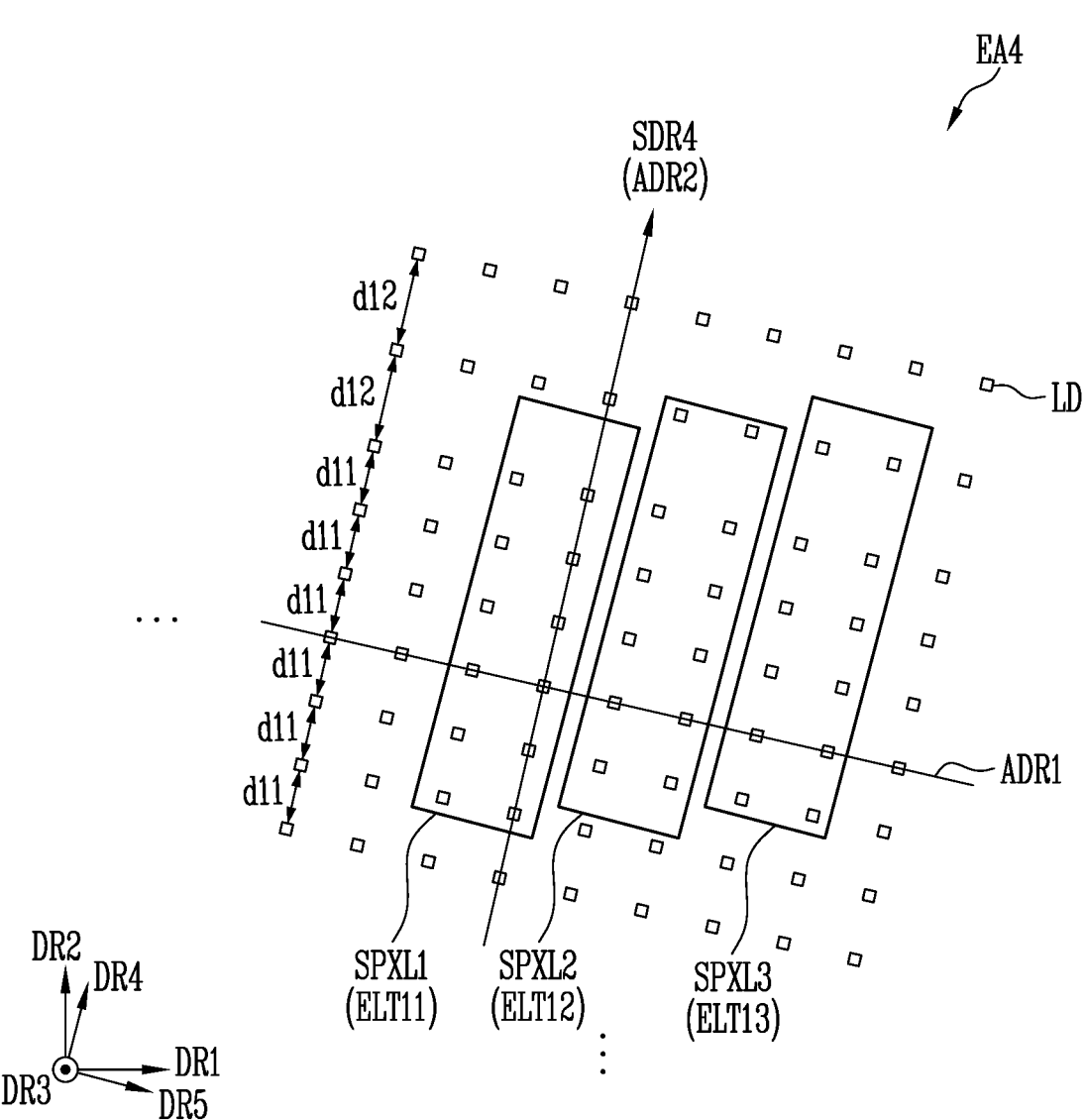
FIGS. 11A and 11B are schematic enlarged views of EA4 of FIG. 2.
Figure 11B:
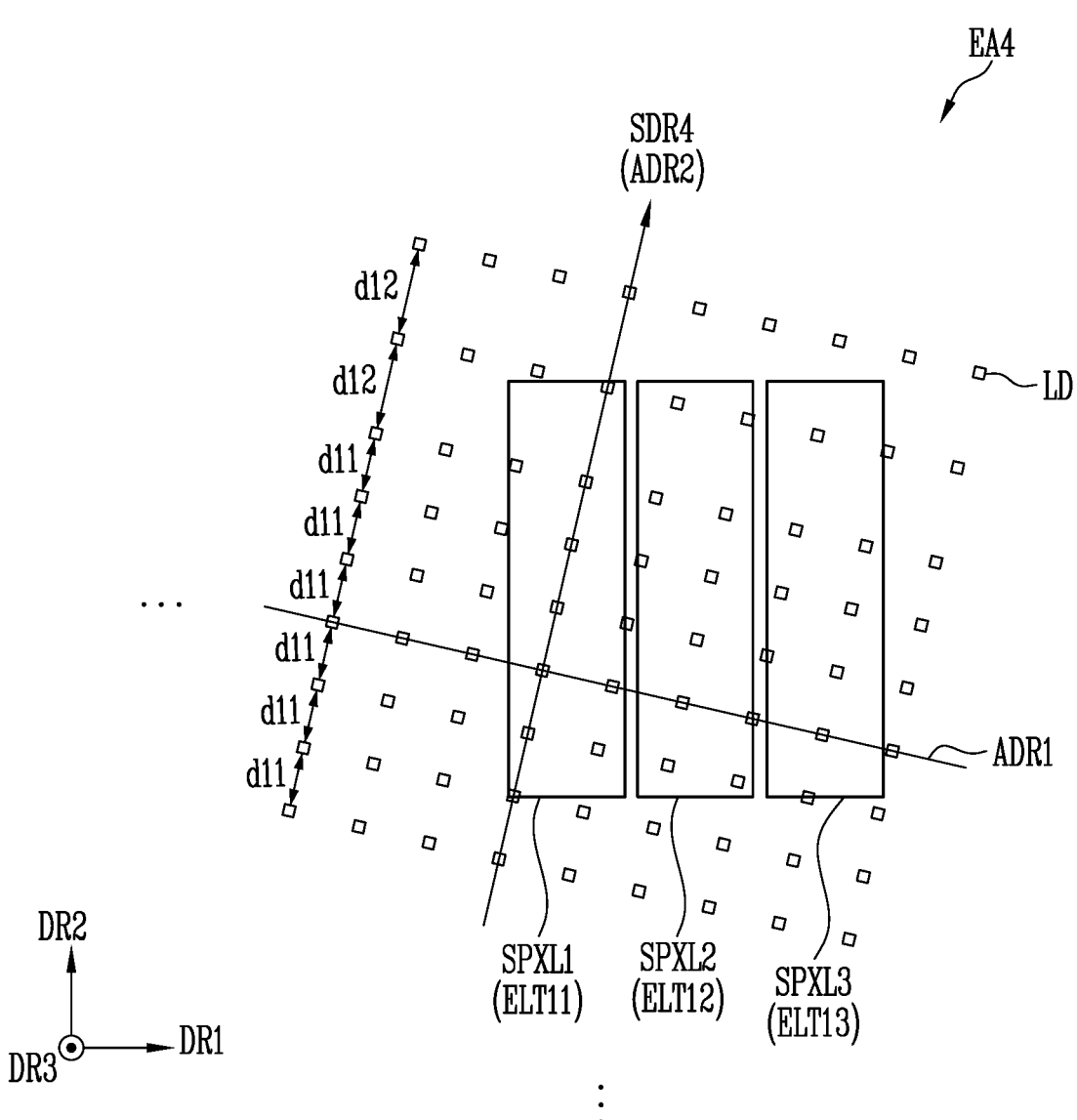

FIGS. 9A and 9B are schematic enlarged views of area EA2 of FIG. 2. FIGS. 10A and 10B are schematic enlarged views of area EA3 of FIG. 2. FIGS. 11A and 11B are schematic enlarged views of EA4 of FIG. 2. Since the enlarged views shown in FIGS. 9A to 11B differ from the enlarged views shown in FIGS. 8A and 8B only in the enlarged area of the display area DA, repetitive descriptions will be omitted and differences therebetween will be briefly described.

Referring to FIGS. 9A and 9B, since a main stretching direction SDR2 is the first arrangement direction ADR1 in area EA2, the first arrangement distance d12 between the light emitting elements LD in the outer portion of the display area DA may be greater than the second arrangement distance d11 between the light emitting elements LD in the central portion of the display area DA.

As the embodiment shown in FIG. 9A, in case that the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 are rotated by an angle in the clockwise direction to correspond to the stretching direction of the donor film 16 (see FIG. 20), the number (e.g., twelve) of the light emitting elements LD disposed on the 1-3-th electrode ELT13 (or the third anode) of the third sub-pixel SPXL3 may be substantially the same as the number (e.g., twelve) of the light emitting elements LD disposed on the 1-1-th electrode ELT11 (or the first anode) of the first sub-pixel SPXL1 and the 1-2-th electrode ELT12 (or the second anode) of the second sub-pixel SPXL2, or may be smaller than or equal to a difference.

On the other hand, as shown in FIG. 9B, in case that the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 are spaced apart from each other in the first direction DR1 and extend in the second direction DR2, the number (e.g., seven) of the light emitting elements LD disposed on the 1-3-th electrode ELT13 (or the third anode) of the third sub-pixel SPXL3 may be smaller than the number (e.g., eleven) of the light emitting elements LD disposed on the 1-1-th electrode ELT11 (or the first anode) of the first sub-pixel SPXL1 and the 1-2-th electrode ELT12 (or the second anode) of the second sub-pixel SPXL2.

Referring to FIGS. 10A and 10B, since a main stretching direction SDR3 is the second arrangement direction ADR2 in area EA3, the first arrangement distance d12 between the light emitting elements LD in the outer portion of the display area DA may be greater than the second arrangement distance d11 between the light emitting elements LD in the central portion of the display area DA.

As the embodiment shown in FIG. 10A, in case that the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 are rotated by an angle in the clockwise direction to correspond to the stretching direction of the donor film 16 (see FIG. 20), the number (e.g., twelve) of the light emitting elements LD disposed on the 1-1-th electrode ELT11 (or the first anode) of the first sub-pixel SPXL1 may be substantially the same as the number (e.g., twelve) of the light emitting elements LD disposed on the 1-2-th electrode ELT12 (or the second anode) of the second sub-pixel SPXL2 and the 1-3-th electrode ELT13 (or the third anode) of the third sub-pixel SPXL3, or may be smaller than or equal to a difference.

On the other hand, as shown in FIG. 10B, in case that the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 are spaced apart from each other in the first direction DR1 and extend in the second direction DR2, the number (e.g., eight) of the light emitting elements LD disposed on the 1-1-th electrode ELT11 (or the first anode) of the first sub-pixel SPXL1 may be smaller than the number (e.g., ten) of the light emitting elements LD disposed on the 1-2-th electrode ELT12 (or the second anode) of the second sub-pixel SPXL2 and the 1-3-th electrode ELT13 (or the third anode) of the third sub-pixel SPXL3.

Referring to FIGS. 11A and 11B, since a main stretching direction SDR4 is the second arrangement direction ADR2 in area EA4, the first arrangement distance d12 between the light emitting elements LD in the outer portion of the display area DA may be greater than the second arrangement distance d11 between the light emitting elements LD in the central portion of the display area DA.

As the embodiment shown in FIG. 11A, in case that the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 are rotated by an angle in the clockwise direction to correspond to the stretching direction of the donor film 16 (see FIG. 20), the number (e.g., twelve) of the light emitting elements LD disposed on the 1-3-th electrode ELT13 (or the third anode) of the third sub-pixel SPXL3 may be substantially the same as the number (e.g., twelve) of the light emitting elements LD disposed on the 1-1-th electrode ELT11 (or the first anode) of the first sub-pixel SPXL1 and the 1-2-th electrode ELT12 (or the second anode) of the second sub-pixel SPXL2, or may be smaller than or equal to a difference.

On the other hand, as shown in FIG. 11B, in case that the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 are spaced apart from each other in the first direction DR1 and extend in the second direction DR2, the number (e.g., seven) of the light emitting elements LD disposed on the 1-3-th electrode ELT13 (or the third anode) of the third sub-pixel SPXL3 may be smaller than the number (e.g., ten) of the light emitting elements LD disposed on the 1-1-th electrode ELT11 (or the first anode) of the first sub-pixel SPXL1 and the 1-2-th electrode ELT12 (or the second anode) of the second sub-pixel SPXL2.

As described above, according to the embodiment, the number of the light emitting elements LD which are not disposed on the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3, may be minimized.

Hereinafter, another embodiment will be described. In the following embodiment, the same configuration as the above-described embodiments will be omitted or simplified, and the differences will be described.

Figure 12:
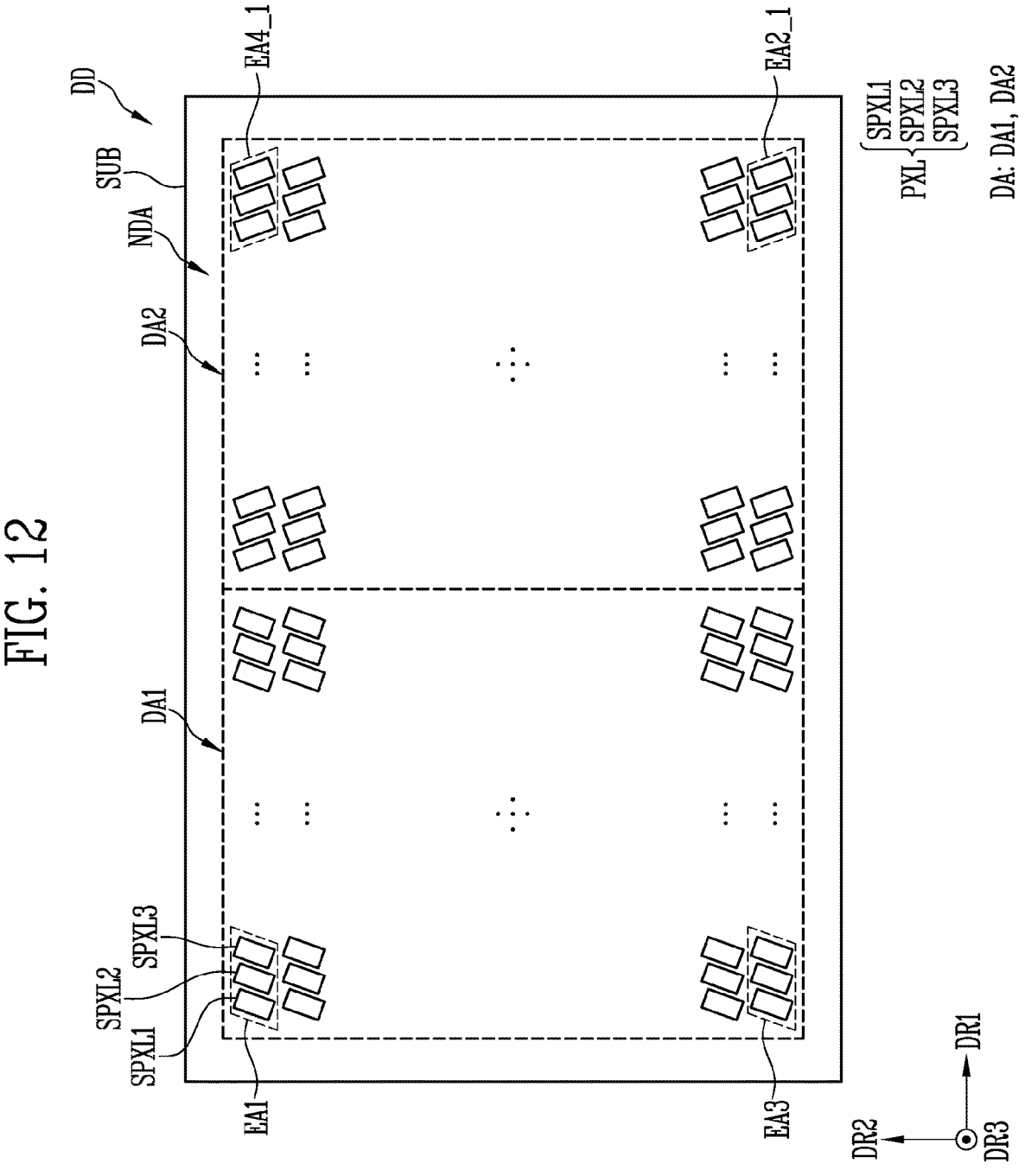
FIG. 12 is a plan view schematically illustrating a display device according to another embodiment.
Figure 13A:
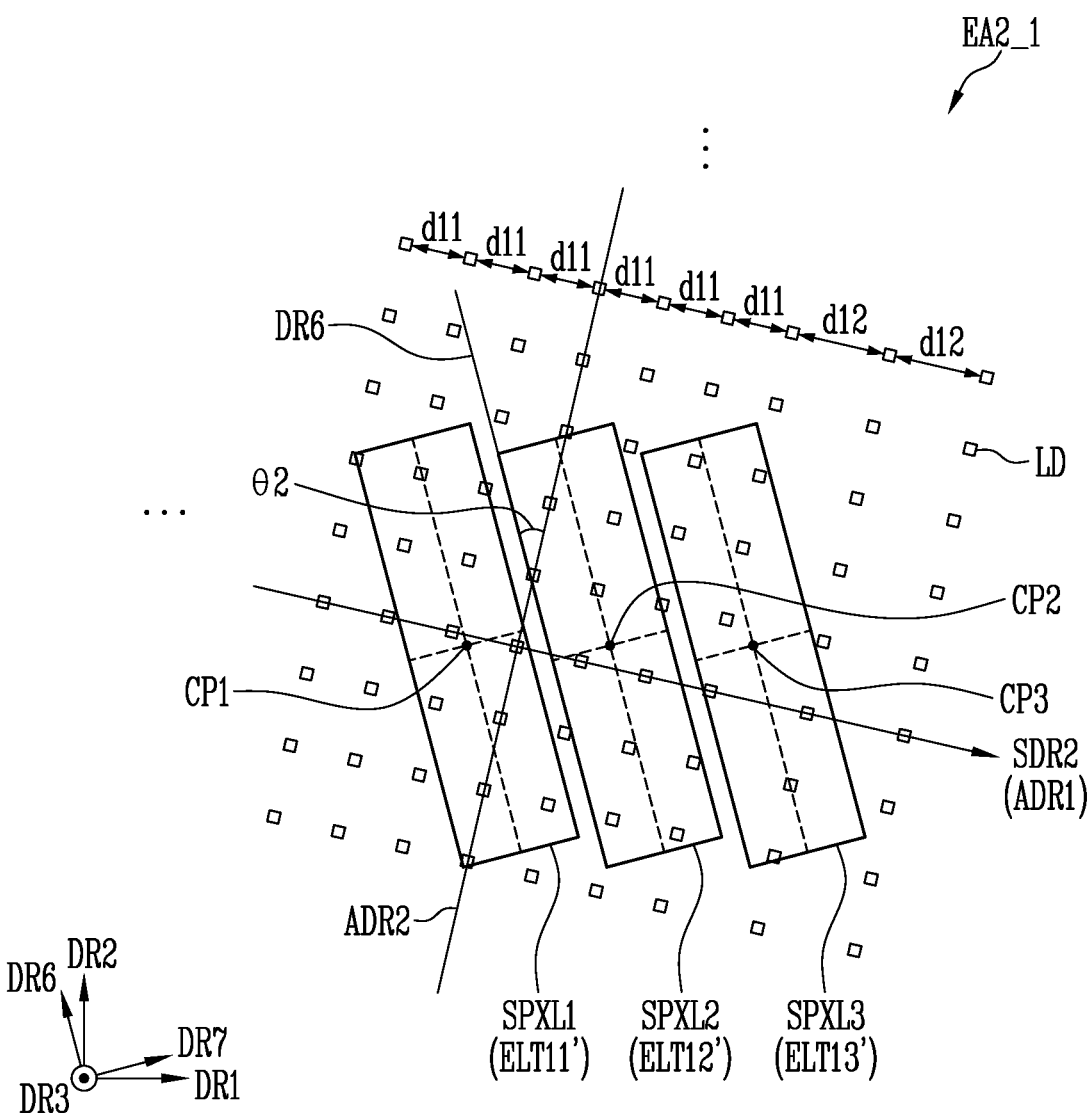
FIGS. 13A and 13B are enlarged views of EA2_1 of FIG. 12.
Figure 13B:
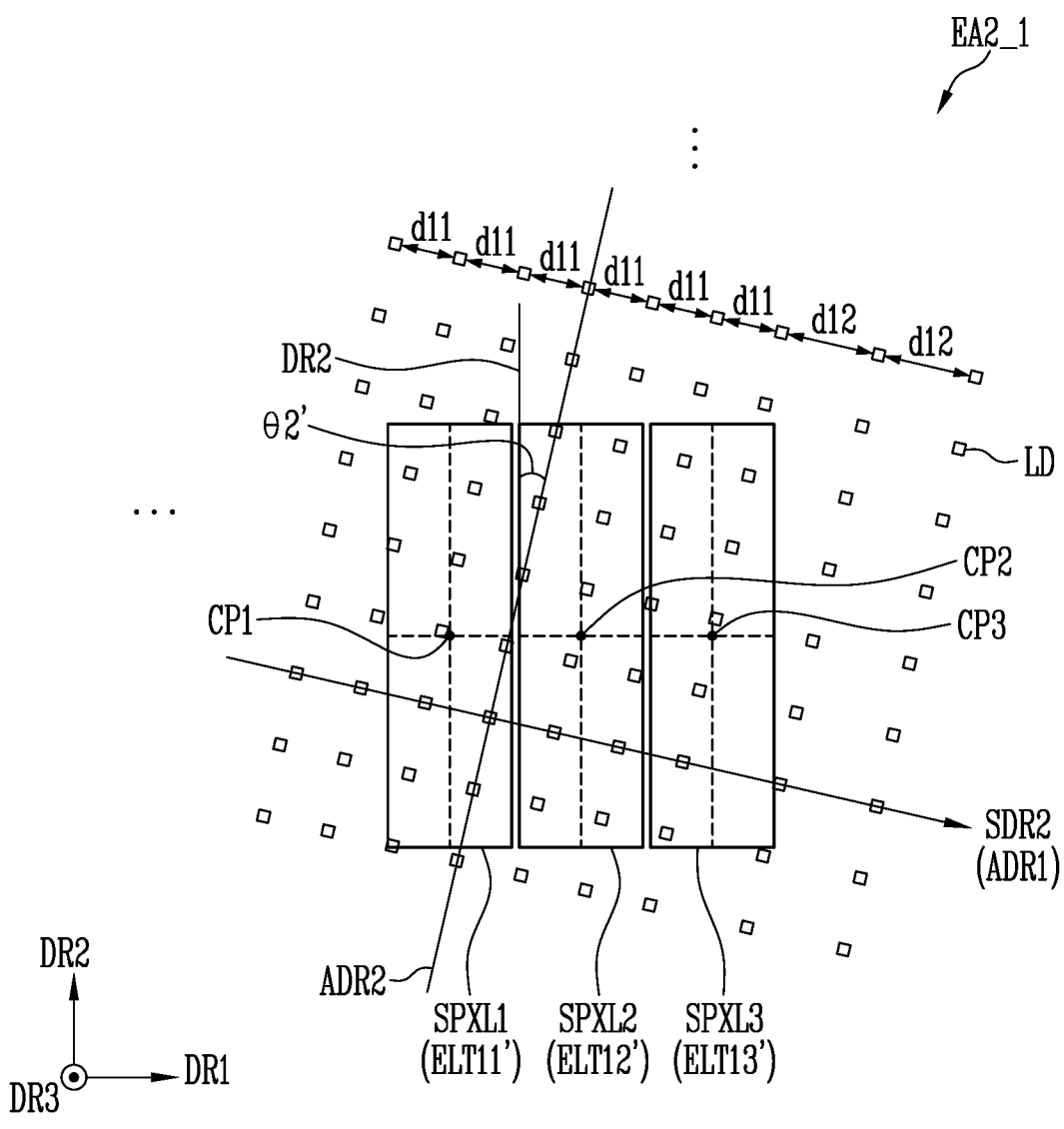
Figure 14A:
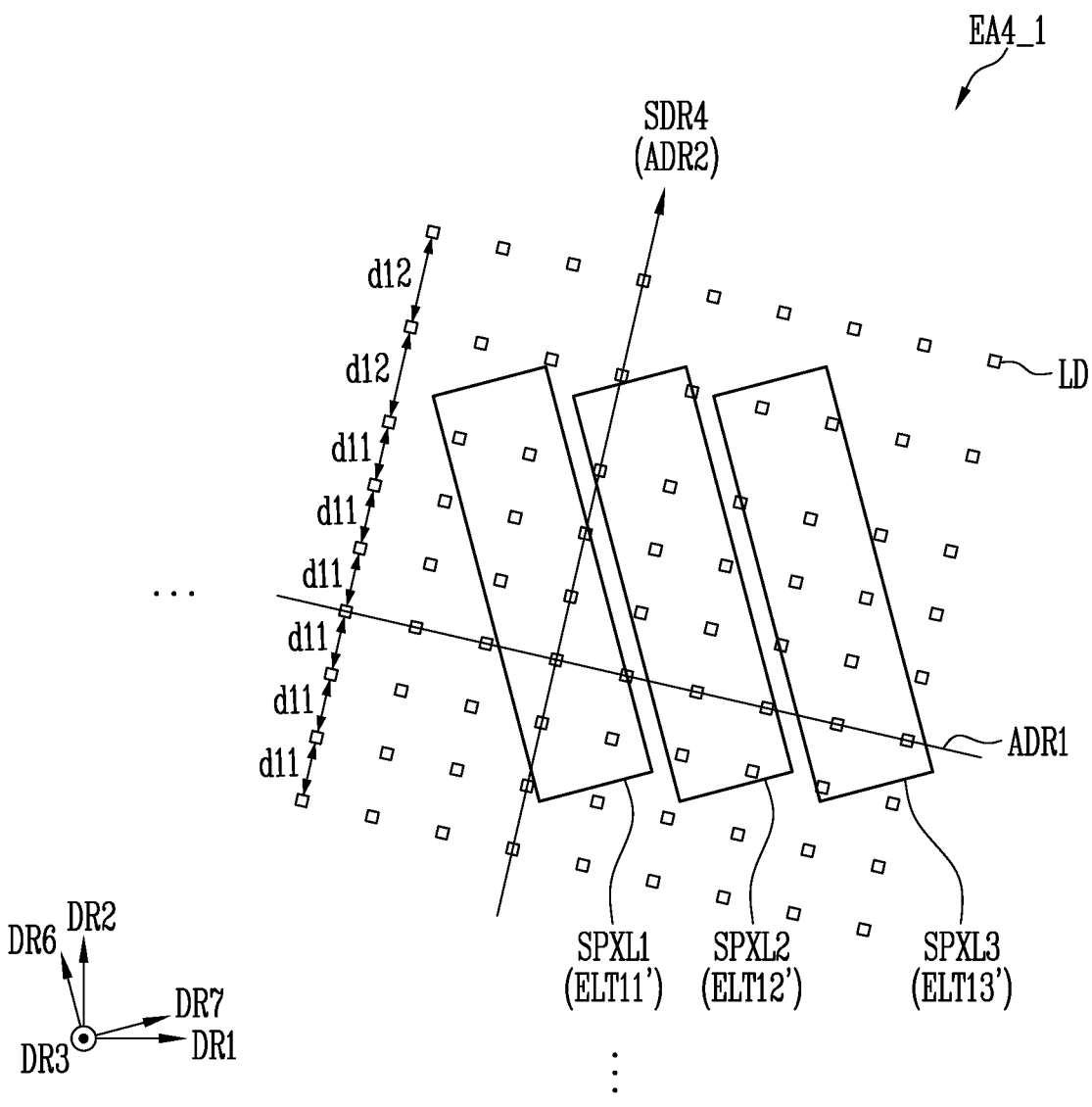
FIGS. 14A and 14B are enlarged views of EA4_1 of FIG. 12.
Figure 14B:
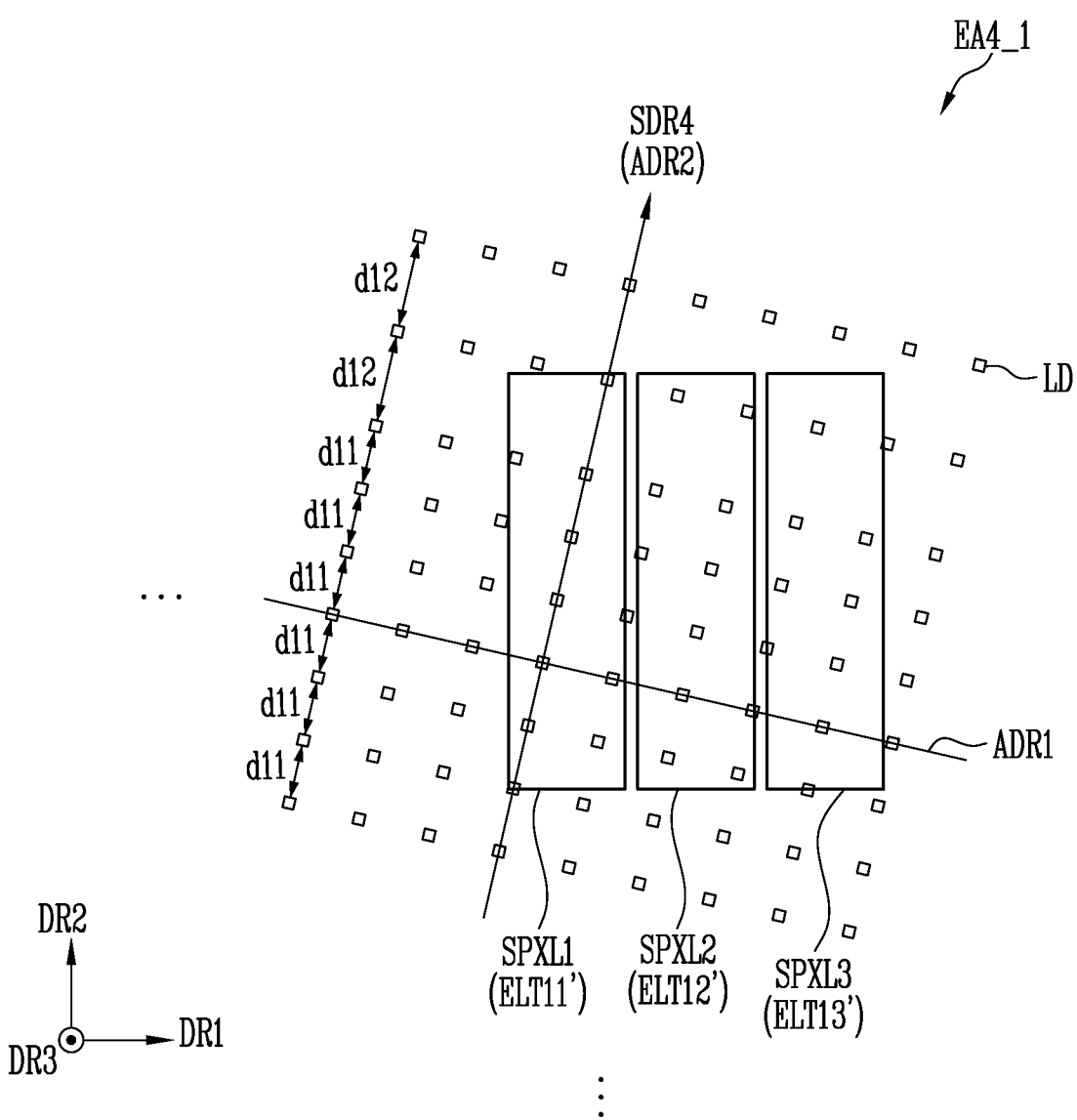

FIG. 12 is a plan view schematically illustrating a display device according to another embodiment. FIGS. 13A and 13B are schematic enlarged views of area EA2_1 of FIG. 12. FIGS. 14A and 14B are schematic enlarged views of area EA4_1 of FIG. 12.

The embodiment shown in FIG. 12 may be different from the embodiment of FIG. 2 at least in that the display area DA includes a first display area DA1 and a second display area DA2 divided in half in the first direction DR1 (or an area of the first display area and an area of the second display area being substantially equal to each other), and the rotation direction of the pixels PXL disposed in the first display area DA1 is different from the rotation direction of the pixels PXL disposed in the second display area DA2. Hereinafter, a description of the first display area DA1 that is substantially the same as the embodiment of FIG. 2 will be omitted, and the second display area DA2 will be described.

Specifically, referring to FIGS. 12 to 13B, in the second display area DA2, a 1-1-th electrode ELT11' (or the first anode) of the first sub-pixel SPXL1 may be formed by rotating by an angle in the counterclockwise direction with respect to the first center point CP1. The 1-2-th electrode ELT12' (or the second anode) of the second sub-pixel SPXL2 may be formed by rotating by an angle in a counterclockwise direction with respect to the second center point CP2. Also, the 1-3-th electrode ELT13' (or the third anode) of the third sub-pixel SPXL3 may be formed by rotating by an angle in a counterclockwise direction with respect to the third center point CP3. In this case, the amount (or a size of the angle) rotated in the counterclockwise direction in the second display area DA2 shown in FIG. 13A may be substantially the same as the amount (or a size of the angle) rotated in the clockwise direction in the first display area DA1 shown in FIG. 8A.

Accordingly, each of the 1-1-th electrode ELT11' (or the first anode) of the first sub-pixel SPXL1, a 1-2-th electrode ELT12' (or the second anode) of the second sub-pixel SPXL2, and a 1-3-th electrodes ELT13' (or the third anode) of the third sub-pixel SPXL3 may extend in a sixth direction DR6, and may be disposed to be spaced apart from each other in a seventh direction DR7.

The light emitting elements LD may be arranged in a matrix form. The light emitting elements LD may be disposed according to a matrix defined by a row direction extending in the first arrangement direction ADR1 and a column direction extending in the second arrangement direction ADR2.

In the area EA2_1, since the main stretching direction SDR2 is the first arrangement direction ADR1, the first arrangement distance d12 between the light emitting elements LD in the outer portion of the second display area DA2 may be greater than the second arrangement distance d11 between the light emitting elements LD in the central portion of the display area DA.

As the embodiment shown in FIG. 13A, in case that the 1-1-th electrode ELT11' (or the first anode) of the first sub-pixel SPXL1, the 1-2-th electrode ELT12' (or the second anode) of the second sub-pixel SPXL2, and the 1-3-th electrode ELT13' (or the third anode) of the third sub-pixel SPXL3 are rotated by an angle in the counterclockwise direction to correspond to the stretching direction of the donor film 16 (see FIG. 20), the number (e.g., nine) of the light emitting elements LD disposed on the 1-3-th electrode ELT13' (or the third anode) of the third sub-pixel SPXL3 may be substantially the same as each of the number (e.g., ten) of the light emitting elements LD disposed on the 1-1-th electrode ELT11' (or the first anode) of the first sub-pixel SPXL1 and the number (e.g., ten) of the light emitting elements LD disposed on the 1-2-th electrode ELT12' (or the second anode) of the second sub-pixel SPXL2, or may be smaller than or equal to a difference. In this case, the sixth direction DR6 and the second arrangement direction ADR2 may be non-parallel to each other. For example, the sixth direction DR6 and the second arrangement direction ADR2 may form an angle θ2 of an acute angle.

On the other hand, as shown in FIG. 13B, in case that the 1-1-th electrode ELT11' (or the first anode) of the first sub-pixel SPXL1, the 1-2-th electrode ELT12' (or the second anode) of the second sub-pixel SPXL2, and the 1-3-th electrode ELT13' (or the third anode) of the third sub-pixel SPXL3 are spaced apart from each other in the first direction DR1 and extend in the second direction DR2, the number (e.g., eight) of the light emitting elements LD disposed on the 1-3-th electrode ELT13' (or the third anode) of the third sub-pixel SPXL3 may be smaller than each of the number (e.g., eleven) of the light emitting elements LD disposed on the 1-1-th electrode ELT11' (or the first anode) of the first sub-pixel SPXL1 and the number (e.g., eleven) of the light emitting elements LD disposed on the 1-2-th electrode ELT12' (or the second anode) of the second sub-pixel SPXL2. Even in the embodiment of FIG. 13B, the sixth direction DR6 and the second arrangement direction ADR2 may be non-parallel to each other. For example, the sixth direction DR6 and the second arrangement direction ADR2 may form an angle θ2' of an acute angle. In this case, the angle θ2' in FIG. 13B may be smaller than the angle θ2 in FIG. 13A.

Referring to FIGS. 14A and 14B, since the main stretching direction SDR4 is the second arrangement direction ADR2 in the area EA4_1, the first arrangement distance d12 between the light emitting elements LD in the outer portion of the second display area DA2 may be greater than the second arrangement distance d11 between the light emitting elements LD in the central portion of the display area DA.

As the embodiment shown in FIG. 14A, in case that the 1-1-th electrode ELT11' (or the first anode) of the first sub-pixel SPXL1, the 1-2-th electrode ELT12' (or the second anode) of the second sub-pixel SPXL2, and the 1-3-th electrode ELT13' (or the third anode) of the third sub-pixel SPXL3 are rotated by an angle in the counterclockwise direction to correspond to the stretching direction of the donor film 16 (see FIG. 20), the number (e.g., nine) of the light emitting elements LD disposed on the 1-3-th electrode ELT13' (or the third anode) of the third sub-pixel SPXL3 may be substantially the same as each of the number (e.g., nine) of the light emitting elements LD disposed on the 1-1-th electrode ELT11' (or the first anode) of the first sub-pixel SPXL1 and the number (e.g., ten) of the light emitting elements LD disposed on the 1-2-th electrode ELT12' (or the second anode) of the second sub-pixel SPXL2, or may be smaller than or equal to a difference.

On the other hand, as shown in FIG. 14B, in case that the 1-1-th electrode ELT11' (or the first anode) of the first sub-pixel SPXL1, the 1-2-th electrode ELT12' (or the second anode) of the second sub-pixel SPXL2, and the 1-3-th electrode ELT13' (or the third anode) of the third sub-pixel SPXL3 are spaced apart from each other in the first direction DR1 and extend in the second direction DR2, the number (e.g., seven) of the light emitting elements LD disposed on the 1-3-th electrode ELT13' (or the third anode) of the third sub-pixel SPXL3 may be smaller than each of the number (e.g., nine) of the light emitting elements LD disposed on the 1-1-th electrode ELT11' (or the first anode) of the first sub-pixel SPXL1 and the number (e.g., ten) of the light emitting elements LD disposed on the 1-2-th electrode ELT12' (or the second anode) of the second sub-pixel SPXL2.

As described above, according to the embodiment, the number of the light emitting elements LD which are not disposed on the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3, may be minimized.

Figure 15:
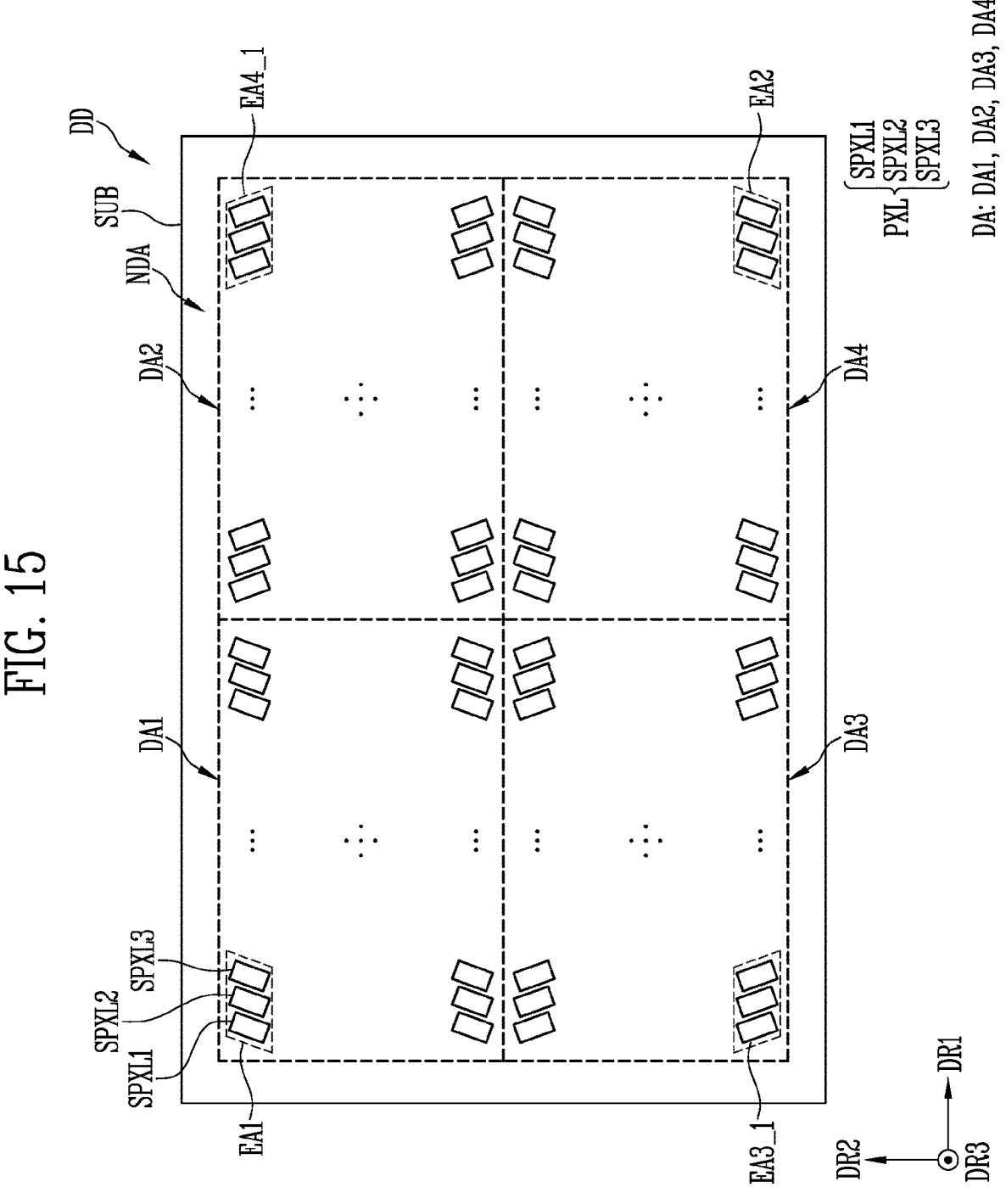
FIG. 15 is a plan view schematically illustrating a display device according to another embodiment.
Figure 16A:
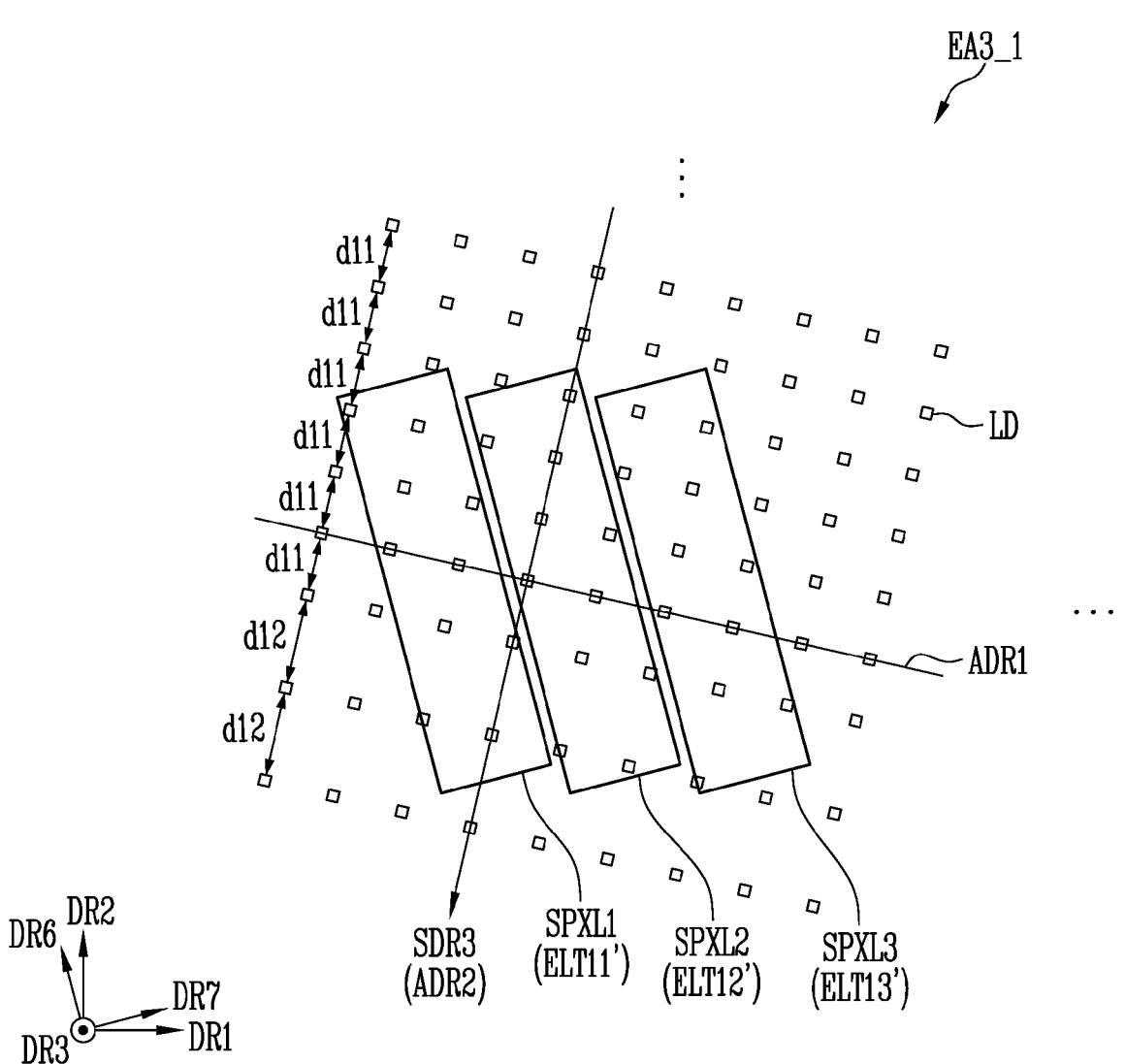
FIGS. 16A and 16B are schematic enlarged views of EA3_1 of FIG. 15.
Figure 16B:
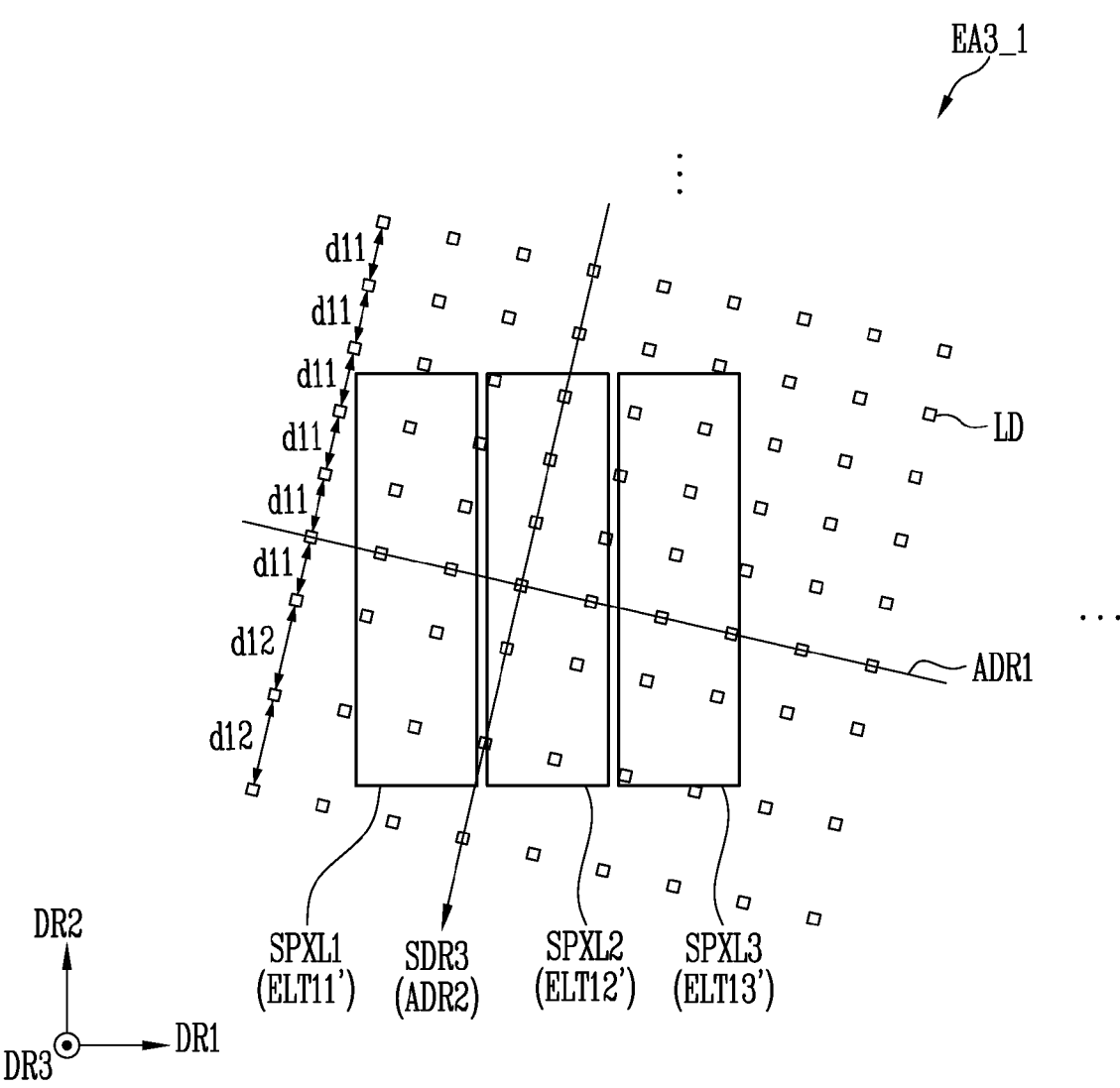

FIG. 15 is a plan view schematically illustrating a display device according to another embodiment. FIGS. 16A and 16B are schematic enlarged views of area EA3_1 of FIG. 15.

The embodiment shown in FIG. 15 is different from the embodiment of FIG. 12 at least in that the display area DA further includes a third display area DA3 in which the first display area DA1 of FIG. 12 is divided in half in the second direction DR2 and a fourth display area DA4 in which the second display area DA2 is divided in half in the second direction DR2, a rotation direction of the pixels PXL disposed on the third display area DA3 is different from a rotation direction of the pixels PXL disposed on the first display area DA1, and a rotation direction of the pixels PXL disposed on the fourth display area DA4 is different from a rotation direction of the pixels PXL disposed on the second display area DA2. Since the first display area DA1 and the fourth display area DA4 are substantially the same as the embodiment of FIG. 2, and the second display area DA2 is substantially the same as the embodiment of FIG. 12, the third display area DA3 will be described.

Specifically, referring to FIGS. 15 to 16B, in the third display area DA3, the 1-1-th electrode ELT11' (or the first anode) of the first sub-pixel SPXL1 may be formed by rotating by an angle in a counterclockwise direction with respect to the first center point CP1. Accordingly, each of the 1-1-th electrode ELT11' (or the first anode) of the first sub-pixel SPXL1, the 1-2-th electrode ELT12' (or the second anode) of the second sub-pixel SPXL2, and the 1-3-th electrodes ELT13' (or the third anodes) of the third sub-pixel SPXL3 may extend in the sixth direction DR6, and may be disposed to be spaced apart from each other in the seventh direction DR7.

The light emitting elements LD may be arranged in a matrix form. The light emitting elements LD may be disposed according to a matrix form defined by a row direction extending in the first arrangement direction ADR1 and a column direction extending in the second arrangement direction ADR2.

In the area EA3_1, since the main stretching direction SDR3 is the second arrangement direction ADR2, the first arrangement distance d12 between the light emitting elements LD in the outer portion of the third display area DA3 may be greater than the second arrangement distance d11 between the light emitting elements LD in the central portion of the display area DA.

As the embodiment shown in FIG. 16A, in case that the 1-1-th electrode ELT11' (or the first anode) of the first sub-pixel SPXL1, the 1 th electrode ELT12' (or the second anode) of the second sub-pixel SPXL2, and the 1-3-th electrode ELT13' (or the third anode) of the third sub-pixel SPXL3 are rotated by an angle in the counterclockwise direction to correspond to the stretching direction SDR3 of the donor film 16 (see FIG. 20), the number (e.g., ten) of the light emitting elements LD disposed on the 1-1-th electrode ELT11' (or the first anode) of the first sub-pixel SPXL1 may be substantially the same as each of the number (e.g., ten) of the light emitting elements LD disposed on the 1-2-th electrode ELT12' (or the second anode) of the second sub-pixel SPXL2 and the number (e.g., ten) of the light emitting elements LD disposed on the 1-3-th electrode ELT13' (or the third anode) of the third sub-pixel SPXL3, or may be smaller than or equal to a difference.

On the other hand, as shown in FIG. 16B, in case that the 1-1-th electrode ELT11' (or the first anode) of the first sub-pixel SPXL1, the 1-2-th electrode ELT12' (or the second anode) of the second sub-pixel SPXL2, and the 1-3-th electrode ELT13' (or the third anode) of the third sub-pixel SPXL3 are spaced apart from each other in the first direction DR1 and extend in the second direction DR2, the number (e.g., eight) of the light emitting elements LD disposed on the 1-1-th electrode ELT11' (or the first anode) of the first sub-pixel SPXL1 may be smaller than each of the number (e.g., ten) of the light emitting elements LD disposed on the 1-2-th electrode ELT12' (or the second anode) of the second sub-pixel SPXL2 and the number (e.g., nine) of the light emitting elements LD disposed on the 1-3-th electrode ELT13' (or the third anode) of the third sub-pixel SPXL3.

As described above, according to the embodiment, the number of the light emitting elements LD which are not disposed on the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3, may be minimized.

Hereinafter, a manufacturing method of the display device DD according to the embodiment will be described with reference to FIGS. 17 to 23. Descriptions that may overlap with the above will be briefly described or omitted.

Figure 17:
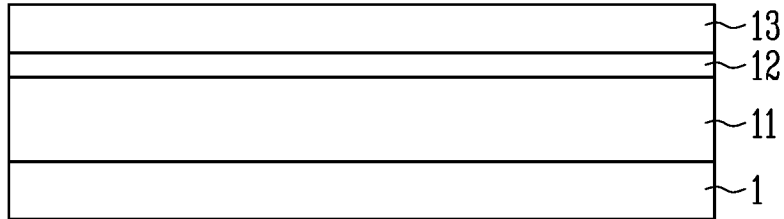
FIGS. 17 to 23 are drawings schematically illustrating a manufacturing method of a display device.

FIGS. 17 to 23 are schematic views for illustrating a manufacturing method of a display device. Referring to FIG. 17, a base substrate 1 may be prepared (or provided), and a first semiconductor layer 11, an active layer 12, and a second semiconductor layer 13 may be formed on the base substrate 1.

According to an embodiment, the base substrate 1 may be a wafer for epitaxial growth of a material. According to an embodiment, the base substrate 1 may be any one of a sapphire substrate, a GaAs substrate, a Ga substrate, and an InP substrate, but is not limited thereto. For example, in case that a specific material satisfies a selectivity for manufacturing the light emitting element LD and epitaxial growth of the material is smoothly performed, the specific material may be selected as the material of the base substrate 1.

In this step, the first semiconductor layer 11, the active layer 12, and the second semiconductor layer 13 may be formed by a method of a metalorganic chemical vapor deposition (MOCVD), a molecular beam epitaxy (MBE), a vapor phase epitaxy (VPE), and a liquid phase epitaxy (LPE).

Figure 18:
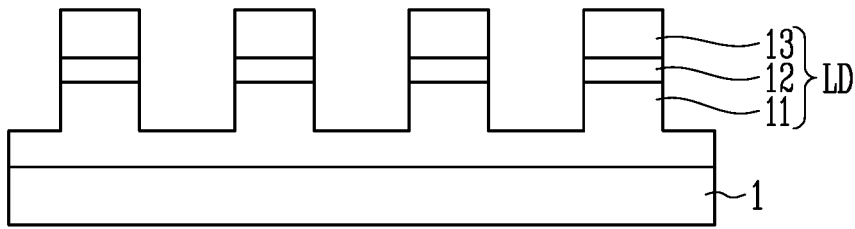

Referring to FIG. 18, at least a portion of each of the first semiconductor layer 11, the active layer 12, and the second semiconductor layer 13 may be removed to provide light emitting elements LD that are individually separated from each other.

In this step, an etching process may be performed on the first semiconductor layer 11, the active layer 12, and the second semiconductor layer 13. To form individually separated light emitting elements LD, a mask (not shown) may be disposed on a structure in which the first semiconductor layer 11, the active layer 12, and the second semiconductor layer 13 are sequentially stacked, and an etching process be performed thereon, so that the structure is patterned at nanoscale or microscale distances. The etching process may be performed in a direction from the second semiconductor layer 13 toward the first semiconductor layer 11.

According to an embodiment, the etching process may be one of a reactive ion etching (RIE), a reactive ion beam etching (RIBE), and an inductively coupled plasma reactive ion etching (ICP-RIE), but is not limited to a specific example.

In this step, the provided light emitting elements LD may be patterned in the matrix form defined by the first arrangement direction ADR1 and the second arrangement direction ADR2.

Figure 19:
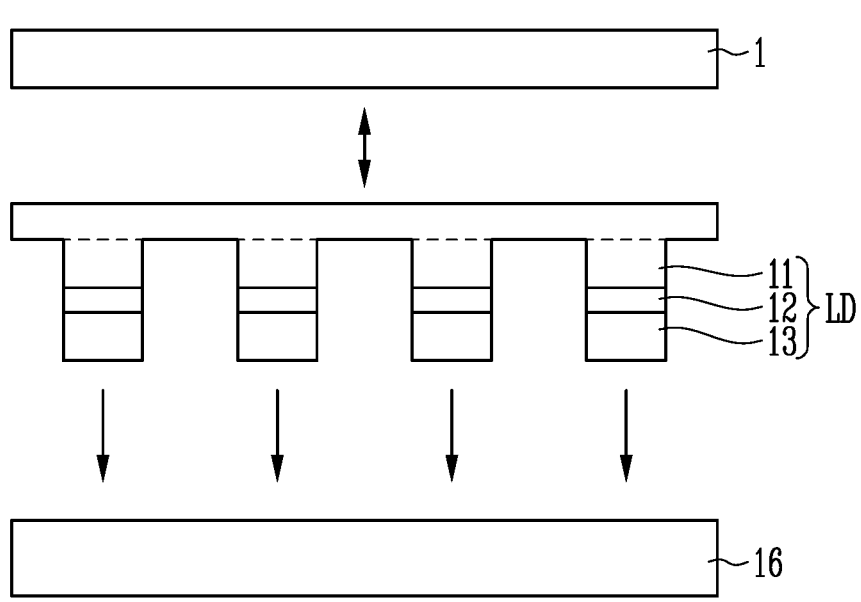

Referring to FIG. 19, the base substrate 1 may be separated from the light emitting elements LD, and the light emitting elements LD may be coupled (disposed or connected) to the donor film 16.

In this step, the base substrate 1 may be physically separated from the first semiconductor layer 11. According to an embodiment, the base substrate 1 and the first semiconductor layer 11 may be separated by a laser lift-off (LLO) method. However, the disclosure is not limited thereto, and according to an embodiment, the base substrate 1 and the first semiconductor layer 11 may be separated by a chemical lift-off (CLO) method.

In this step, a layer that is formed in the same process as the first semiconductor layer 11 and does not form each light emitting element LD because separate etching is not performed thereon, may also be removed. Accordingly, by performing this step, light emitting element (LD) arrays patterned at distances may be provided on the donor film 16.

According to an embodiment, the donor film 16 may be a component for providing the light emitting element LD at a position before performing a subsequent process (e.g., a process of disposing the light emitting element LD on the substrate SUB and the pixel circuit layer PCL). The donor film 16 may be referred to as a donor wafer or donor substrate. The donor film 16 may be an isotropically stretchable film. According to an embodiment, the donor film 16 may include a polymer composition (e.g., a polyvinyl chloride (PVC)-based material), but is not limited to a specific example.

According to an embodiment, the light emitting elements LD patterned in this step may be arranged in the matrix form including a row direction extending in the first arrangement direction ADR1 and a column direction extending in the second arrangement direction ADR2.

Figure 20:
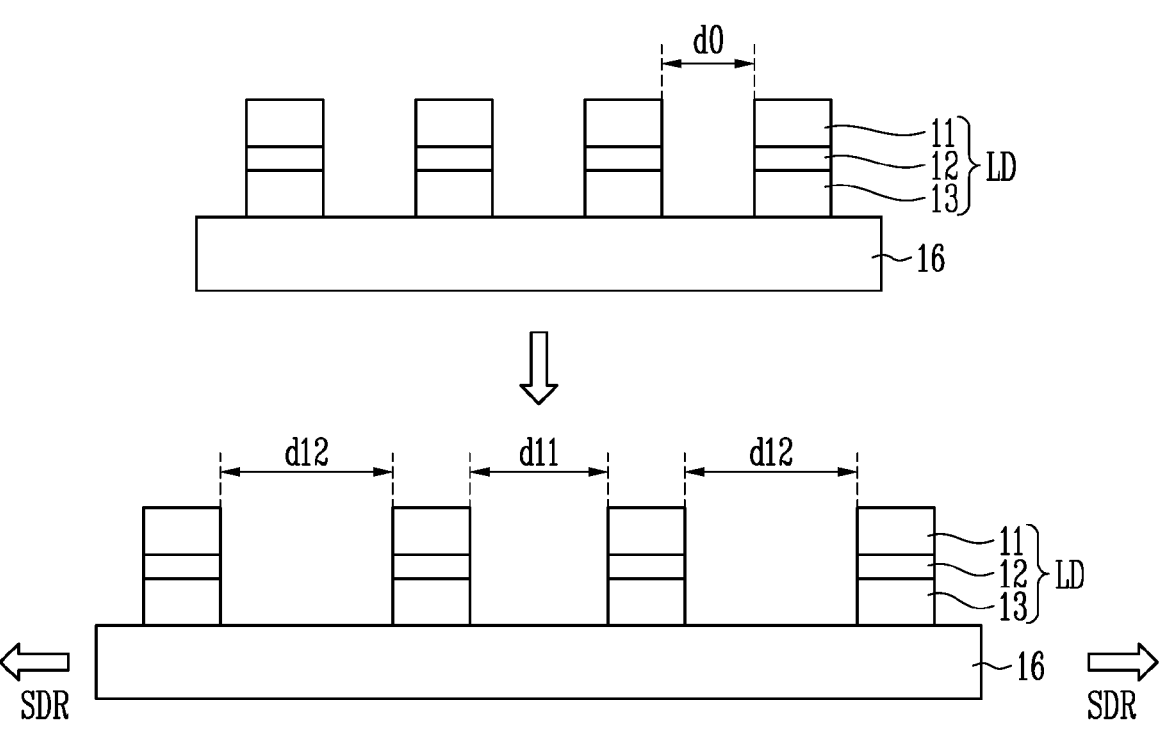

Referring to FIG. 20, the donor film 16 may be deformed. The area of the donor film 16 in a plan view may be increased. The donor film 16 may extend in a direction. The donor film 16 may extend in a direction of the surface of the donor film 16 such as the first and second arrangement directions ADR1 and ADR2.

The light emitting elements LD adjacent to each other on the donor film 16 before this step is performed, may be spaced apart from each other by an undeformed distance d0.

For example, the light emitting elements LD may be arranged in the matrix form on the donor film 16, and the light emitting elements LD adjacent to each other may be spaced apart from each other at an undeformed distance d0. The undeformed distance d0 may refer to the shortest distance between the light emitting elements LD adjacent to each other in a plan view. For example, the light emitting elements LD adjacent to each other in the first arrangement direction ADR1 or the second arrangement direction ADR2 may be spaced apart from each other by an undeformed distance d0.

According to the embodiment, in this step, the donor film 16 may be generally radially uniformly expanded, but in a stretching direction SDR, the first arrangement distance d12 between the light emitting elements LD in the outer portion of the donor film 16 may be greater than the second arrangement distance d11 between the light emitting elements LD in the central portion of the donor film 16. Accordingly, the first arrangement distance d12 between the light emitting elements LD in the outer portion of the substrate SUB (or the display area DA) shown in FIG. 21 may be greater than the second arrangement distance d11 between the light emitting elements LD in the central portion of the substrate SUB (or the display area DA).

In this step, the length (or area) of the donor film 16 may be expanded, so that a separation distance between the light emitting elements LD may be increased. According to an embodiment, the donor film 16 may be physically extended, but various methods may be applied thereto, and the disclosure is not limited to a specific example.

Figure 21:
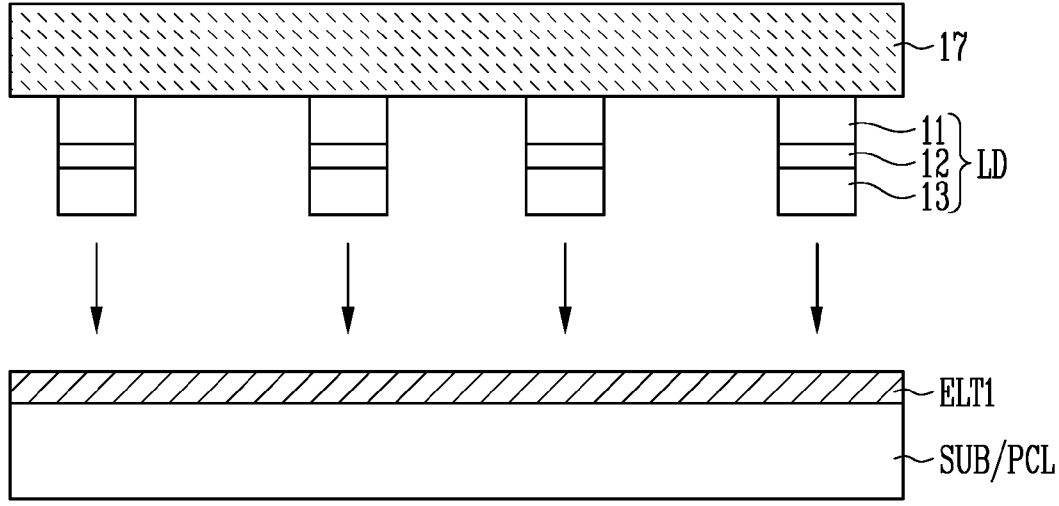
Figure 22:
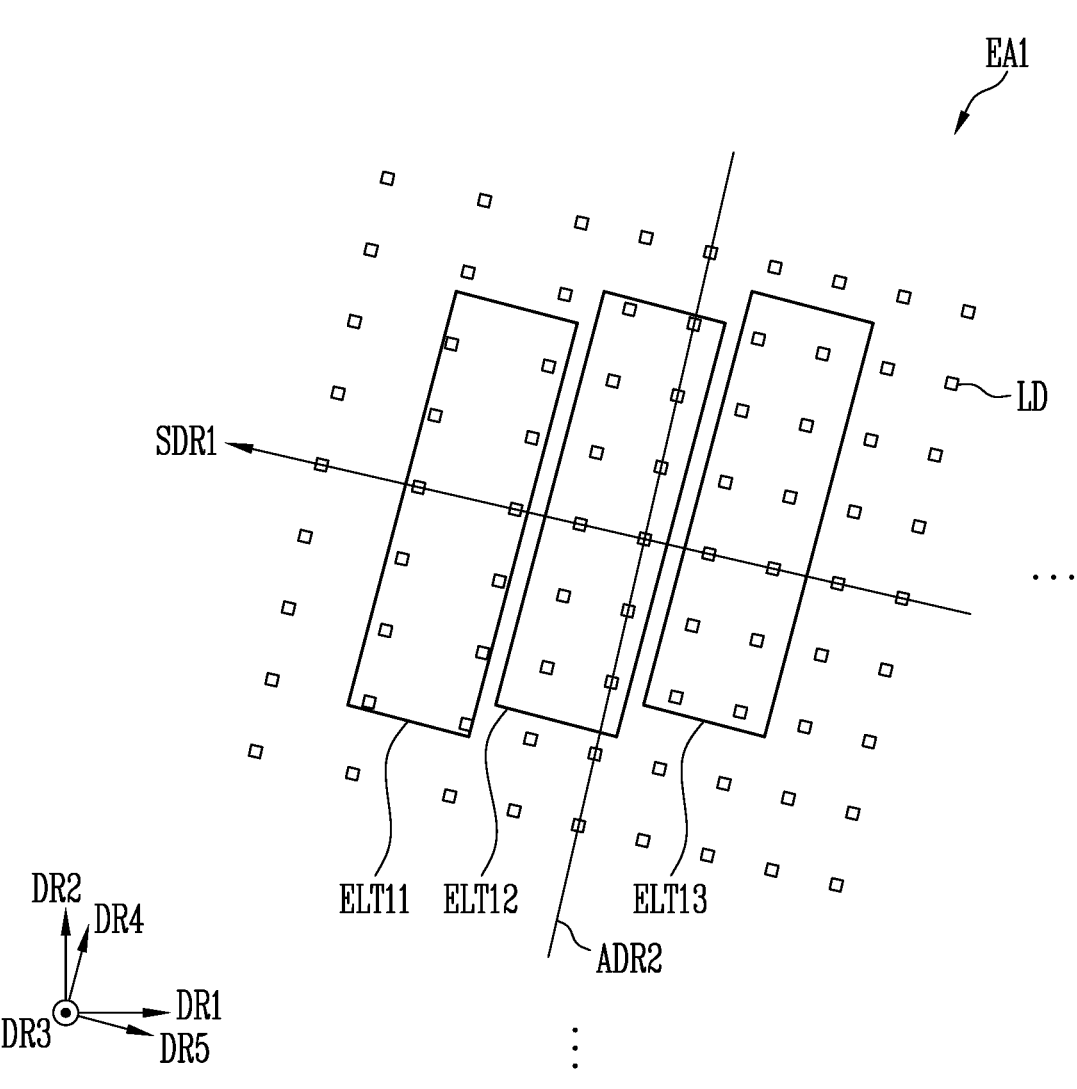

Referring to FIGS. 21 and 22, the light emitting element LD may be transferred onto the substrate SUB and the pixel circuit layer PCL by using a transfer member 17.

In this step, the transfer member 17 may be configured to transfer the light emitting element LD onto the substrate SUB and the pixel circuit layer PCL by coupling (e.g., connecting or extending) the array of light emitting elements LD, provided on the donor film 16, to a surface thereof. The transfer member 17 may simultaneously pick up each of the light emitting elements LD and may place them on the substrate SUB and the pixel circuit layer PCL. According to an embodiment, the pick-up process of the transfer member 17 may be an elastomeric stamping method, an electromagnetic method, or a method using an adhesive member, but is not limited to a specific example.

In this step, the light emitting element LD and the transfer member 17 may be coupled (e.g., connected or extended) so that the first semiconductor layer 11 faces the transfer member 17, and the light emitting elements LD may be arranged so that the second semiconductor layer 13 faces the first electrode ELT1.

Referring to FIGS. 3, 5, and 22, this step may include preparing the substrate SUB before transferring the light emitting element LD onto the substrate SUB by using the transfer member 17.

The preparing of the substrate SUB may include forming the pixel circuit layer PCL including the first pixel circuit area PXC1, the second pixel circuit area PXC2, and the third pixel circuit area PXC3 which are arranged in the first direction DR1 and extend in the second direction DR2, and forming the display element layer DPL including the 1-1-th electrode ELT11 (or the first anode) of the first sub-pixel SPXL1 corresponding to the first pixel circuit area PXC1, the 1-2-th electrode ELT12 (or the second anode) of the second sub-pixel SPXL2 corresponding to the second pixel circuit area PXC2, and the 1-3-th electrode ELT13 (or the third anode) of the third sub-pixel SPXL3 corresponding to the third pixel circuit area PXC3.

In the step of forming the display element layer DPL, each of the 1-1-th electrode ELT11 (or the first anode) of the first sub-pixel SPXL1 corresponding to the first pixel circuit area PXC1, the 1-2-th electrode ELT12 (or the second anode) of the second sub-pixel SPXL2 corresponding to the second pixel circuit area PXC2, and the 1-3-th electrodes ELT13 (or the third anode) of the third sub-pixel SPXL3 corresponding to the third pixel circuit area PXC3, may be rotated by an angle in the clockwise or counterclockwise direction with respect to the first to third center points CP1, CP2, and CP3 (see FIG. 8A), respectively to extend in the fourth direction DR4 and to be spaced apart from each other in the fifth direction DR5.

According to an embodiment, the 1-1-th electrode ELT11 (or the first anode) of the first sub-pixel SPXL1, the 1-2-th electrode ELT12 (or the second anode) of the second sub-pixel SPXL2, and the 1-3-th electrode ELT13 (or the third anode) of the third sub-pixel SPXL3 may be formed by rotating in the clockwise direction by an angle with respect to the first to third center points CP1, CP2, and CP3, respectively. In this case, the angle may be designed to increase as the first arrangement distance d12 is greater than the second arrangement distance d11. However, the angle may increase until the extension direction (e.g., the fourth direction DR4) of the sub-pixels SPXL1, SPXL2, and SPXL3 coincides with the second arrangement direction ADR2 of the light emitting element LD.

In addition, the fourth direction DR4, which is the extension direction of the first electrodes ELT11, ELT12, and ELT13 of the first to third sub-pixels SPXL1 to SPXL3, and the second arrangement direction ADR2 of the light emitting elements LD may be non-parallel to each other. For example, the fourth direction DR4 and the second arrangement direction ADR2 may form an angle θ1 (see FIG. 8A) of an acute angle. Here, in case that the transfer process (see FIG. 21) of the light emitting element LD using the donor film 16 is performed, a position of the donor film 16 for the substrate SUB and the pixel circuit layer PCL may be adjusted. In this case, by adjusting the position of the donor film 16, the second arrangement direction ADR2 may intersect (or may be non-parallel) with the fourth direction DR4.

Figure 23:
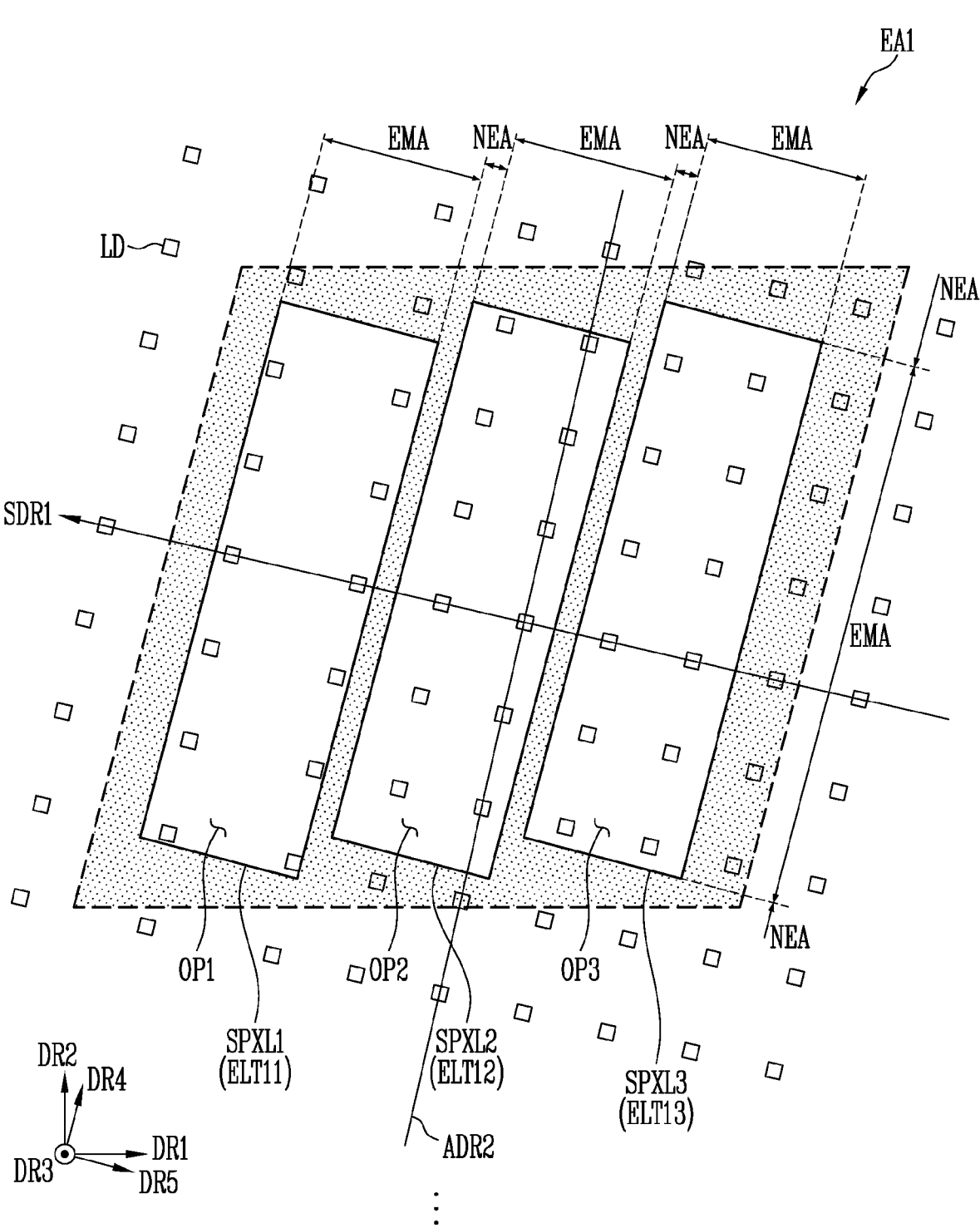

Referring to FIG. 23, the light blocking layer LBL may be formed on the display element layer DPL to define the light emitting areas EMA of the first to third sub-pixels SPXL1, SPXL2, and SPXL3. For example, the light blocking layer LBL may be disposed to form the first to third openings OP1, OP2, and OP3. According to an embodiment, after a base light blocking layer for forming the light blocking layer LBL is formed, a patterning process may be performed in positions corresponding to the first to third openings OP1, OP2, and OP3.

Hereinafter, an application field of the display device DD according to the embodiment will be described with reference to FIGS. 24 to 27. FIGS. 24 to 27 are drawings illustrating examples to which a display device according to an embodiment is applied.

According to an embodiment, the display device DD may be applied to a smartphone, a laptop computer, a tablet personal computer (PC), a TV, or the like, and may be applied to various other embodiments.

Figure 24:
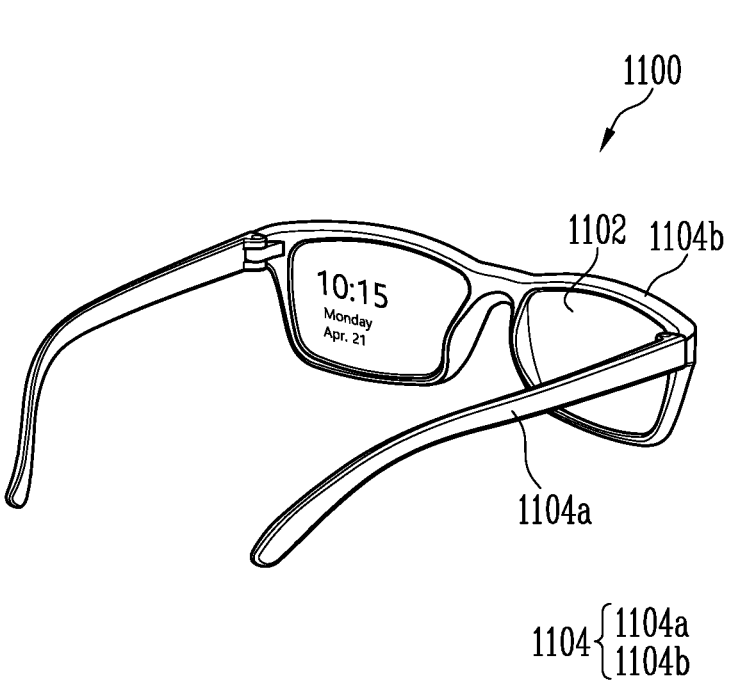
FIGS. 24 to 27 are drawings schematically illustrating examples to which a display device according to an embodiment is applied.

Referring to FIG. 24, the display device DD according to an embodiment may be applied to smart glasses 1100 including a frame 1104 and a lens part 1102. The smart glasses 1100 may be a wearable electronic device that can be worn on a user's face, and may have a structure in which a part of the frame 1104 is folded or unfolded. For example, the smart glasses 1100 may be a wearable device for augmented reality (AR).

The frame 1104 may include a housing 1104b supporting the lens part 1102 and a leg part 1104a for wearing by the user. The leg part 1104a may be folded or unfolded by being electrically connected to the housing 1104b by a hinge.

A battery, a touch pad, a microphone, a camera, and the like may be embedded in the frame 1104. In addition, a projector for outputting light, a processor for controlling an optical signal, and the like may be embedded in the frame 1104.

The lens part 1102 may be an optical member that transmits light or reflects light. The lens part 1102 may include glass, a transparent synthetic resin, or the like.

In addition, the lens part 1102 may reflect an image by an optical signal transferred from the projector of the frame 1104 by a rear surface of the lens part 1102 (e.g., a surface facing the user's eyes) so that the user's eyes can recognize it. For example, as shown in the drawing, the user may recognize information such as time and date displayed on the lens part 1102. For example, the lens part 1102 may be a kind of display device, and the display device DD according to the above-described embodiment may be applied to the lens part 1102.

Figure 25:
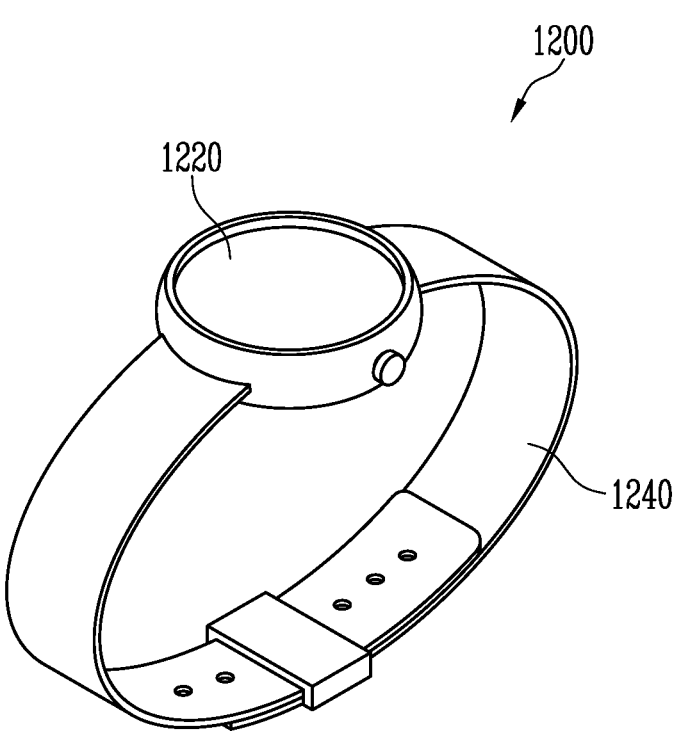

Referring to FIG. 25, the display device DD according to the embodiment may be applied to a smart watch 1200 including a display part 1220 and a strap part 1240.

The smart watch 1200 may be a wearable electronic device, and may have a structure in which the strap part 1240 is mounted on a user's wrist. The display device DD according to the embodiment may be applied to the display part 1220 to provide image data, including time information, to the user.

Figure 26:
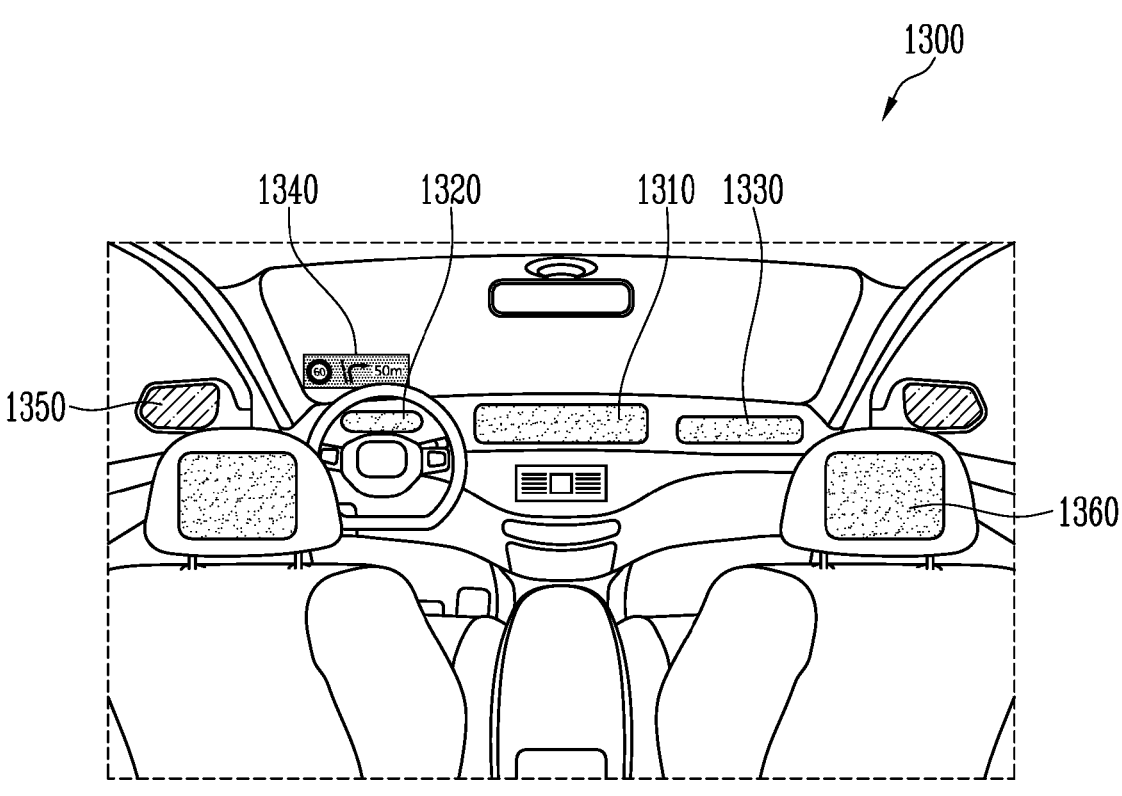

Referring to FIG. 26, the display device DD according to the embodiment may be applied to an automotive display 1300. The automotive display 1300 may refer to an electronic device provided inside and/or outside of a vehicle to provide image data.

According to the embodiment, the display device DD may be applied to at least one of an infotainment panel 1310, a cluster 1320, a co-driver display 1330, a head-up display 1340, a side-view mirror display 1350, and a rear-seat display 1360.

Figure 27:
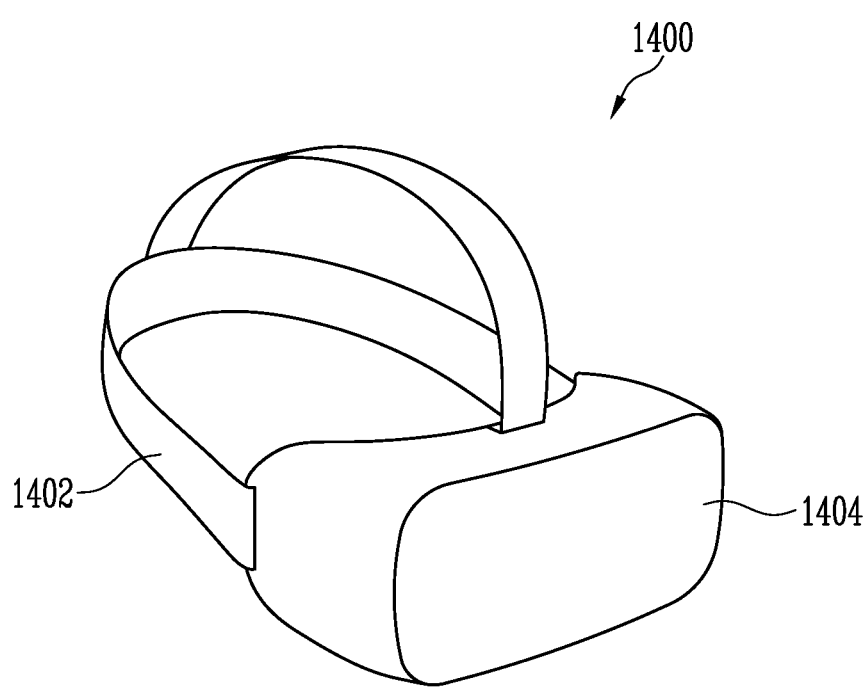

Referring to FIG. 27, the display device DD according to an embodiment may be applied to a head-mounted display (HMD) 1400 including a head-mounted band 1402 and a display storage case 1404. The head mounted display 1400 may be a wearable electronic device that can be worn on a user's head.

The head-mounted band 1402 may be a part connected to the display storage case 1404 and fixing the display storage case 1404. FIG. 27 illustrates that the head-mounted band 1402 may surround an upper surface and both sides of the user's head, but the disclosure is not limited thereto. The head-mounted band 1402 may be provided to fix the head-mounted display 1400 to the user's head, and may be formed in the form of a spectacle frame or a helmet.

The display storage case 1404 may accommodate the display device DD, and may include at least one lens. The at least one lens may be a part that provides an image to a user. For example, the display device DD according to an embodiment may be applied to a left-eye lens and a right-eye lens implemented in the display storage case 1404.

The application field of the display device DD according to the embodiment is not limited to the above-described example, and may be applied to various fields according to the embodiment.

The above description is merely illustrative of the technical spirit of the disclosure, and various modifications and variations will be possible without departing from the essential characteristics of the disclosure by those skilled in the art to which the disclosure pertains. Accordingly, the embodiments of the disclosure described above may be implemented separately or in combination with each other.

Therefore, the embodiments disclosed in the disclosure are not intended to limit the technical spirit of the disclosure, but to explain, and the scope of the technical spirit of the disclosure is not limited by these embodiments. The protection scope of the disclosure should be construed by the following claims, and all technical ideas within the scope equivalent thereto should be construed as being included in the scope of the disclosure.

What is claimed is:

1. A display device comprising:

a pixel circuit layer disposed on a substrate and including a first pixel circuit area and a second pixel circuit area which are spaced apart from each other in a first direction, and extending in a second direction perpendicular to the first direction; and a display element layer disposed on the pixel circuit layer and including:

a first electrode corresponding to the first pixel circuit area; and a second electrode corresponding to the second pixel circuit area, wherein the display element layer includes light emitting elements which are disposed on the first electrode and the second electrode and are arranged in a matrix form defined by a first arrangement direction and a second arrangement direction perpendicular to the first arrangement direction, the first electrode and the second electrode are rotated by an angle in a clockwise or counterclockwise direction with respect to a center point of the first electrode and a center point of the second electrode respectively, to extend in a third direction and be spaced apart from each other in a fourth direction intersecting the third direction, and the third direction and the second arrangement direction are not parallel or orthogonal to each other.

2. The display device of claim 1, wherein the display element layer includes a display area and a non-display area surrounding the display area, and a first arrangement distance between the light emitting elements in an outer portion of the display area is greater than a second arrangement distance between the light emitting elements in a central portion of the display area.

3. The display device of claim 2, wherein the angle increases as the first arrangement distance increases compared to the second arrangement distance.

4. The display device of claim 2, wherein a rotation direction of the first electrode and a rotation direction of the second electrode are substantially identical to each other in an entire display area.

5. The display device of claim 2, wherein the display area includes a first display area and a second display area adjacent to each other in the first direction, an area of the first display area and an area of the second display area being substantially equal to each other, and a rotation direction of the first electrode and a rotation direction of the second electrode are a clockwise direction in the first display area and a counterclockwise direction in the second display area.

6. The display device of claim 5, wherein the display area further includes:

a third display area adjacent to the first display area in the second direction, an area of the third display area and the area of the first display area being substantially equal to each other; and a fourth display area adjacent to the second display area in the second direction, an area of the fourth display area and the area of the second display area being substantially equal to each other, and the rotation directions of the first electrode and the second electrode are the counterclockwise direction in the third display area and the clockwise direction in the fourth display area.

7. The display device of claim 1, wherein the third direction and the second arrangement direction form an acute angle.

8. The display device of claim 1, wherein a portion of the first electrode overlaps the second pixel circuit area in a fifth direction perpendicular to both the first direction and the second direction.

9. The display device of claim 8, wherein the pixel circuit layer further includes a third pixel circuit area which is spaced apart from the first pixel circuit area and the second pixel circuit area in the first direction and extends in the second direction, wherein a portion of the second electrode overlaps the third pixel circuit area in the fifth direction.

10. The display device of claim 9, wherein the display element layer further includes a third electrode which is spaced apart from the first electrode and the second electrode in the fourth direction and corresponds to the third pixel circuit area, and the third electrode is rotated by an angle in the clockwise or counterclockwise direction with respect to a center point of the third electrode to extend in the third direction.

11. The display device of claim 10, wherein a number per unit area of the light emitting elements is substantially identical on the first electrode, the second electrode, and the third electrode.

12. The display device of claim 1, wherein the light emitting element has a size to a degree of a nano-scale to a micro-scale.

13. A manufacturing method of manufacturing the display device of claim 1, comprising:

preparing the substrate in which the pixel circuit layer and the display element layer are sequentially stacked;

forming a first semiconductor layer, an active layer, and a second semiconductor layer on a base substrate;

providing the light emitting elements which are individually separated by etching the first semiconductor layer, the active layer, and the second semiconductor layer, and patterned in a matrix form defined by the first arrangement direction and the second arrangement direction perpendicular to the first arrangement direction;

separating the base substrate from the light emitting elements, and connecting the light emitting elements on a donor film;

stretching the donor film in the first arrangement direction and the second arrangement direction; and disposing the light emitting elements disposed on the stretched donor film on the substrate, wherein the preparing of the substrate includes:

forming the pixel circuit layer including the first pixel circuit area and the second pixel circuit area which are spaced apart from each other in the first direction and extend in the second direction perpendicular to the first direction;

forming the display element layer including the first electrode corresponding to the first pixel circuit area and the second electrode corresponding to the second pixel circuit area on the pixel circuit layer.

14. The manufacturing method of claim 13, wherein the display element layer includes a display area and a non-display area surrounding the display area, and in the stretching of the donor film, a separation distance between the light emitting elements increases, and a first arrangement distance between the light emitting elements in an outer portion of the display area is greater than a second arrangement distance between the light emitting elements in a central portion of the display area.

15. The manufacturing method of claim 14, wherein in the forming of the display element layer, the angle increases as the first arrangement distance increases compared to the second arrangement distance.

16. The manufacturing method of claim 14, wherein in the forming of the display element layer, a rotation direction of the first electrode and a rotation direction of the second electrode are substantially identical to each other in the entire display area.

17. The manufacturing method of claim 14, wherein the display area include a first display area and a second display area adjacent to each other in the first direction, an area of the first display area and an area of the second display area being substantially equal to each other, and in the forming of the display element layer, the rotation directions of the first electrode and the second electrode are a clockwise direction in the first display area and a counterclockwise direction in the second display area.

18. The manufacturing method of claim 17, wherein the display area further includes:

a third display area adjacent to the first display area in the second direction, an area of the third display area and the area of the first display area being substantially equal to each other, and a fourth display area adjacent to the second display area in the second direction, an area of the fourth display area and the area of the second display area being substantially equal to each other, and in the forming of the display element layer, the rotation directions of the first electrode and the second electrode are the counterclockwise direction in the third display area and the clockwise direction in the fourth display area.

19. The manufacturing method of claim 13, wherein the third direction and the second arrangement direction forms an angle having an acute angle therebetween.

20. The manufacturing method of claim 13, wherein a portion of the first electrode overlaps the second pixel circuit area in a fifth direction perpendicular to the first direction and the second direction.

* * * * *